(12) United States Patent
Yu et al.

(10) Patent No.: US 10,190,908 B2
(45) Date of Patent: Jan. 29, 2019

(54) OPTICAL DEVICES AND METHODS OF MAKING SAME

(71) Applicant: Heptagon Micro Optics Pte. Ltd., Singapore (SG)

(72) Inventors: Qichuan Yu, Singapore (SG); Hartmut Rudmann, Jona (CH); Ji Wang, Singapore (SG); Kian Siang Ng, Singapore (SG); Simon Gubser, Weesen (CH); Sonja Hanselmann, Lachen (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/984,278

(22) Filed: May 18, 2018

(65) Prior Publication Data

US 2018/0266877 A1    Sep. 20, 2018

Related U.S. Application Data

(63) Continuation of application No. 15/353,397, filed on Nov. 16, 2016, now Pat. No. 9,976,894.

(60) Provisional application No. 62/257,198, filed on Nov. 18, 2015.

(51) Int. Cl.
   *H01L 31/02*    (2006.01)
   *G01J 1/02*     (2006.01)
   *H01L 31/173*   (2006.01)

(52) U.S. Cl.
   CPC .......... *G01J 1/0295* (2013.01); *G01J 1/0209* (2013.01); *G01J 1/0214* (2013.01); *G01J 1/0271* (2013.01); *H01L 31/173* (2013.01)

(58) Field of Classification Search
   CPC ....... H01L 31/02; H01L 31/17; H01L 31/173; G01J 1/02; G01J 1/02; G01J 1/021; G01J 1/0214; G01J 1/027; G01J 1/0271; G01J 1/0209; G01J 1/029; G01J 1/0295
   USPC ........................................................ 257/80
   See application file for complete search history.

(56) References Cited

U.S. PATENT DOCUMENTS

2012/0223231 A1*  9/2012  Nijaguna ............. G01J 1/0214
                                                     250/338.1

* cited by examiner

*Primary Examiner* — Monica D Harrison
(74) *Attorney, Agent, or Firm* — Fish & Richardson P.C.

(57) ABSTRACT

Disclosed are optical devices and methods of manufacturing optical devices. An optical device can include a substrate; an optical emitter chip affixed to the front surface of the substrate; and an optical sensor chip affixed to the front surface of the substrate. The optical sensor chip can include a main sensor and a reference sensor. The optical device can include an opaque dam separating the main optical sensor and the reference sensor. The optical device can include a first transparent encapsulation block encapsulating the optical emitter chip and the reference optical sensor and a second transparent encapsulation block encapsulating the main optical sensor. The optical device can include an opaque encapsulation material encapsulating the first transparent encapsulation block and the second transparent encapsulation block with a first opening above the main optical sensor and a second opening above the optical emitter chip.

25 Claims, 21 Drawing Sheets

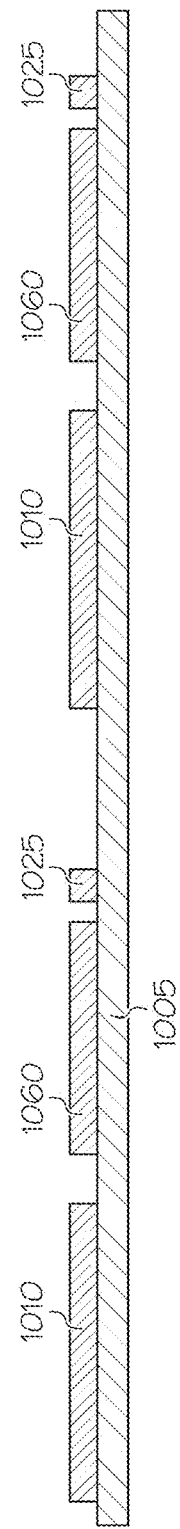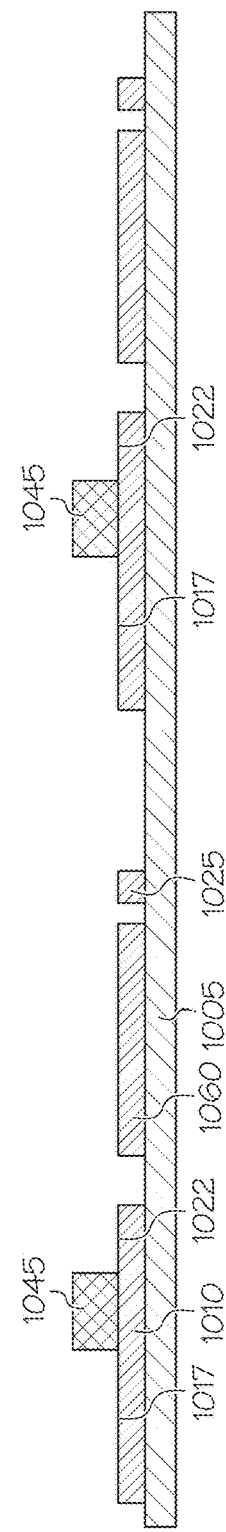

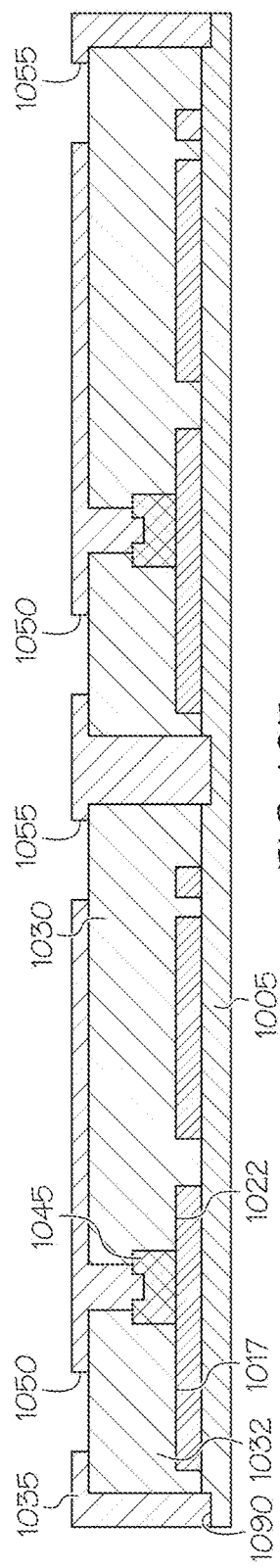
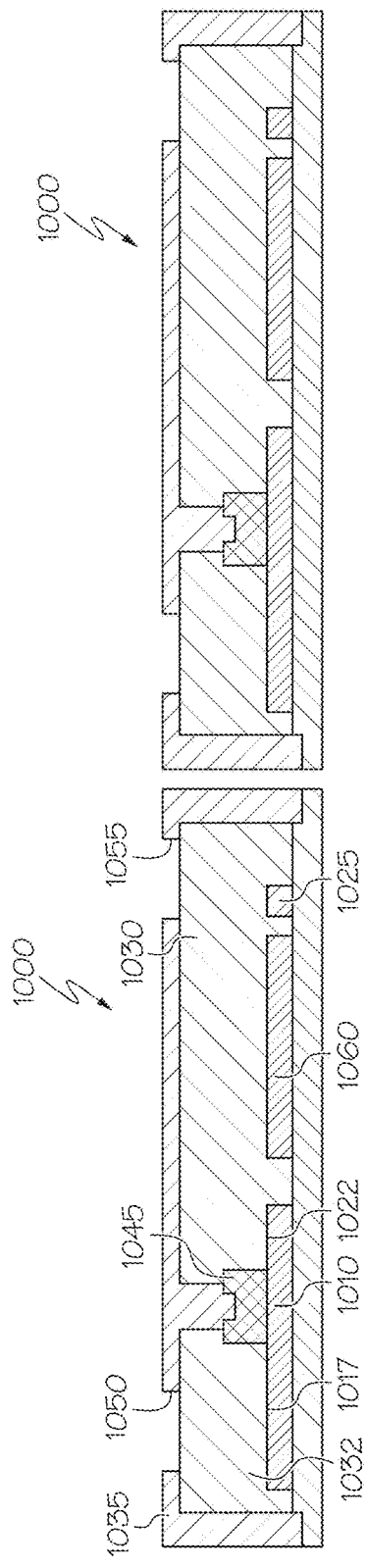
FIG. 10E
FIG. 10F

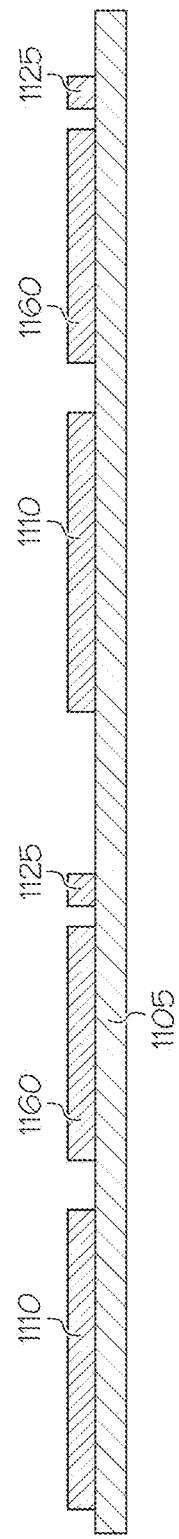
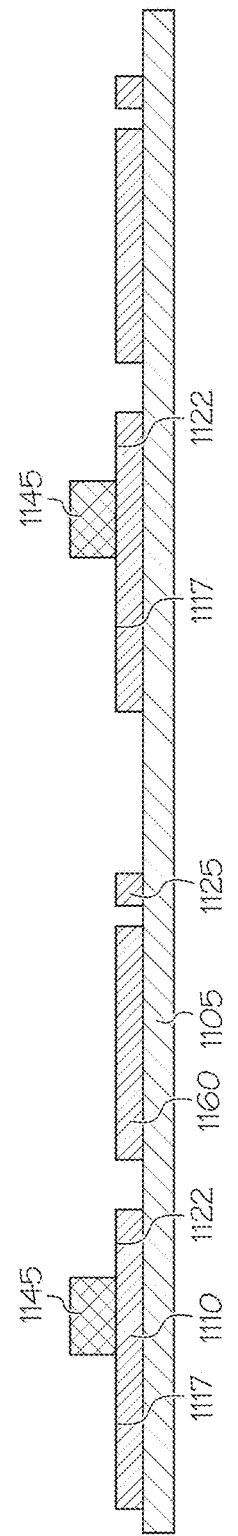
FIG. 11A
FIG. 11B

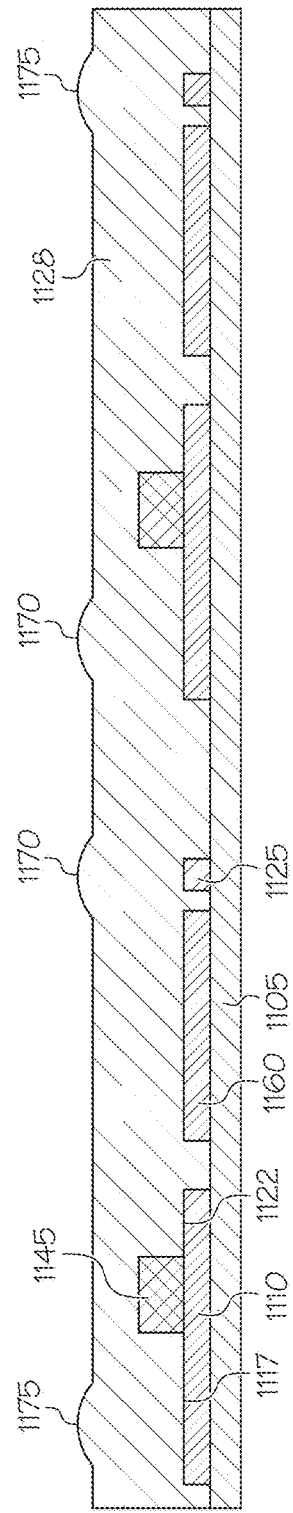
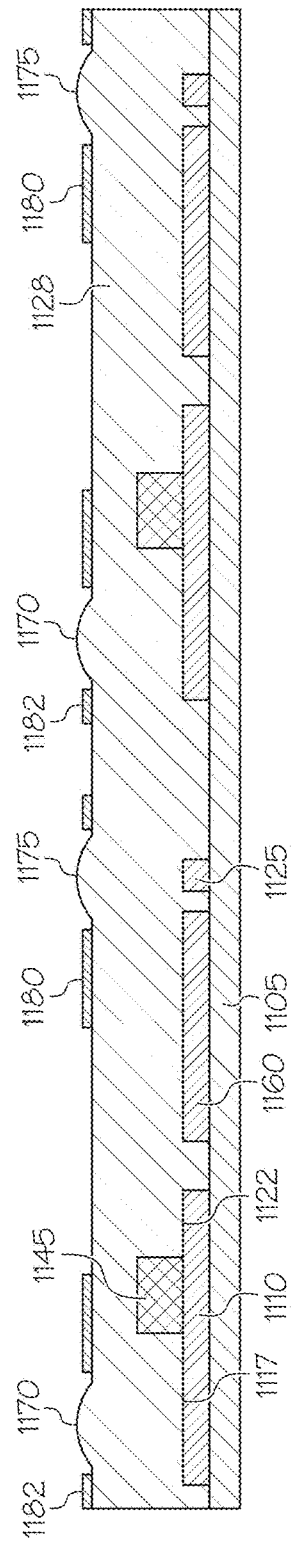
FIG. 11C
FIG. 11D

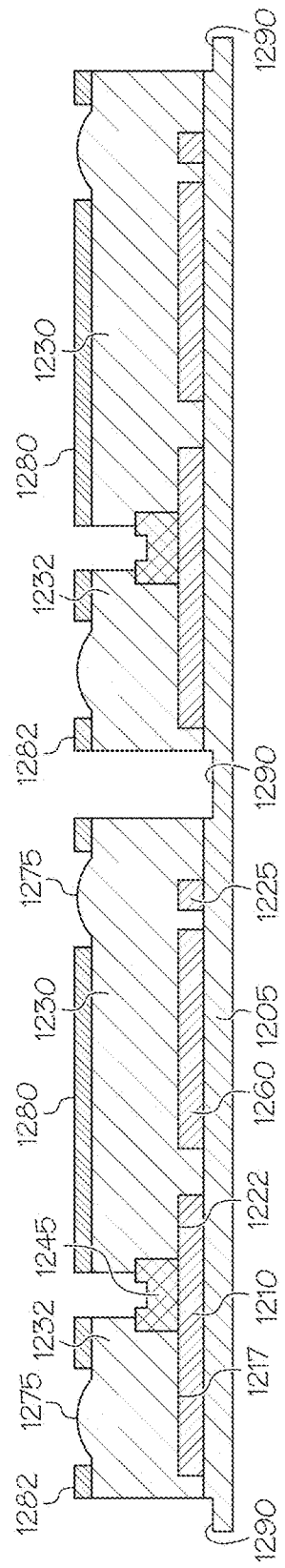
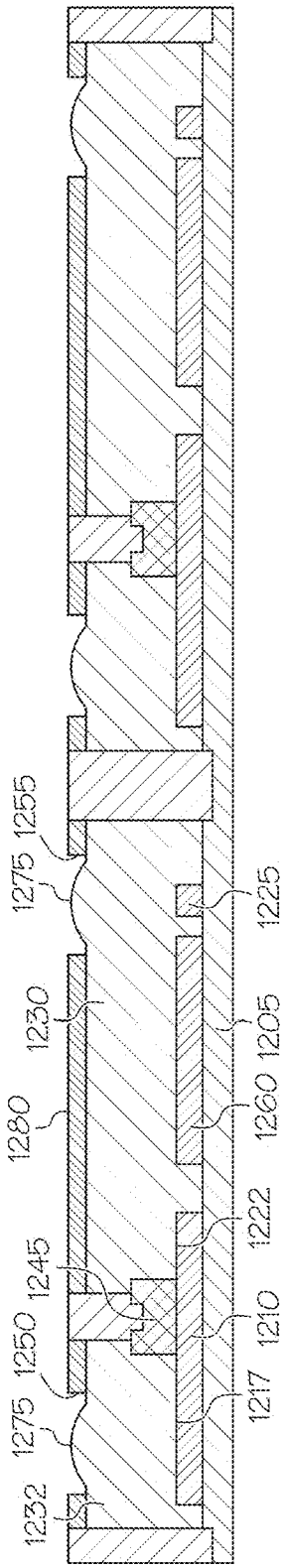

OPTICAL DEVICES AND METHODS OF MAKING SAME

CROSS-REFERENCES TO APPLICATIONS

This application is a continuation of U.S. patent application Ser. No. 15/353,397, filed on Nov. 16, 2016, which claims the benefit of and priority to U.S. Provisional Patent Application No. 62/257,198, filed on Nov. 18, 2015, and titled "OPTICAL DEVICE," the contents of all of which are incorporated herein by reference in their entirety.

The contents of commonly-assigned Patent Cooperation Treaty Application No. PCT/SG2015/050224, filed on Jul. 22, 2015, and titled "OPTOELECTRONIC MODULES INCLUDING AN IMAGE SENSOR HAVING REGIONS OPTICALLY SEPARATED FROM ONE ANOTHER," are hereby incorporated by reference in their entirety.

The contents of commonly-assigned U.S. Patent Application No. 62/256,238, filed on Nov. 17, 2015, and titled "THIN OPTOELECTRONIC MODULES WITH APERTURES AND THEIR MANUFACTURE" are hereby incorporated by reference in their entirety.

FIELD OF THE TECHNOLOGY

The present technology relates generally to optical devices and, more specifically, to packaging for optical devices and methods of manufacture.

BACKGROUND

Optical devices that include one or more optical radiation emitters and one or more optical sensors can be used in a wide range of applications including, for example, distance measurement, proximity sensing, gesture sensing, and imaging. In some applications, such optoelectronic modules can be included in the housings of various consumer electronics, such as mobile computing devices, smart phones, or other devices.

SUMMARY

Accordingly, there is a need for efficient and accurate optical devices and methods of manufacturing the same. In one aspect, there is an optical device. The optical device includes a substrate including a front surface. The optical device includes an optical emitter chip including a front surface and a rear surface, the rear surface of the optical emitter chip affixed to the front surface of the substrate. The optical device includes an optical sensor chip including a front surface and a rear surface, the rear surface of the optical sensor chip affixed to the front surface of the substrate, the optical sensor chip further including at least one main sensor and at least one reference sensor on the front surface of the optical sensor chip. The optical device includes an opaque dam disposed on the front surface of the optical sensor chip and at least a portion of the front face of the substrate, the dam separating the main optical sensor and the reference sensor. The optical device includes a first transparent encapsulation block encapsulating the optical emitter chip and the reference optical sensor. The optical device includes a second transparent encapsulation block encapsulating the main optical sensor. The optical device includes an opaque encapsulation material encapsulating the first transparent encapsulation block and the second transparent encapsulation block, the opaque encapsulation material including a first opening above the main optical sensor and a second opening above the optical emitter chip. The opaque encapsulation material extends between the first transparent encapsulation block and the second transparent encapsulation block and abuts the opaque dam.

In some embodiments, the opaque dam further includes a channel into which the opaque encapsulation material extends. In some embodiments, the opaque encapsulation material further includes a channel into which the opaque dam extends. In some embodiments, the opaque dam is formed from a first opaque epoxy and the opaque encapsulation material is formed from a second opaque epoxy. In some embodiments, the first opaque epoxy has a first viscosity and the second opaque epoxy has a second viscosity, the second viscosity different from the first viscosity.

In some embodiments, the optical device includes at least one trench formed in the substrate, wherein the opaque encapsulation material extends into the at least one trench. In some embodiments, a thickness of the opaque dam disposed over the substrate material is different than a second thickness of the opaque dam disposed over the optical sensor chip. In some embodiments, a first portion of the opaque dam disposed on the front surface of the optical sensor has a first thickness, and a second portion of the opaque dam disposed on at least a portion of the front face of the substrate has a second thickness, the first thickness being less than the second thickness.

In another aspect, there is an optical device. The optical device includes a substrate including a front surface. The optical device includes an optical emitter chip including a front surface and a rear surface, the rear surface of the optical emitter chip affixed to the front surface of the substrate. The optical device includes an optical sensor chip including a front surface and a rear surface, the rear surface of the optical sensor chip affixed to the front surface of the substrate, the optical sensor chip further including at least one main sensor and at least one reference sensor on the front surface of the optical sensor chip. The optical device includes an opaque dam disposed on the front surface of the optical sensor chip and at least a portion of the front face of the substrate, the dam separating the main optical sensor and the reference sensor. The optical device includes a first transparent encapsulation block encapsulating the optical emitter chip and the reference optical sensor, the first transparent encapsulation block including a first passive optical element over the optical emitter chip. The optical device includes a second transparent encapsulation block encapsulating the main optical sensor, the second transparent encapsulation block including a second passive optical element over the main optical sensor. The optical device includes first opaque coating material disposed on the first transparent encapsulation block around the first passive optical element. The optical device includes second opaque coating material disposed on the second transparent encapsulation block around the second passive optical element. The optical device includes an opaque encapsulation material encapsulating the first transparent encapsulation block and the second transparent encapsulation block, the opaque encapsulation material including a first opening aligned with the first passive optical element and a second opening aligned with the second optical element. The opaque encapsulation material extends between the first transparent encapsulation block and the second transparent encapsulation block and abuts the opaque dam.

In some embodiments, the opaque dam further includes a channel into which the opaque encapsulation material extends. In some embodiments, the opaque encapsulation material further includes a channel into which the opaque dam extends. In some embodiments, the opaque dam is formed from a first opaque epoxy and the opaque encapsulation material is formed from a second epoxy. In some embodiments, the first opaque epoxy has a first viscosity and the second opaque epoxy has a second viscosity, the second viscosity different from the first viscosity. In some embodiments, the optical device includes at least one trench formed in the substrate, wherein the opaque encapsulation material extends into the at least one trench.

In some embodiments, a thickness of the opaque dam disposed over the substrate material is different than a second thickness of the opaque dam disposed over the optical sensor chip. In some embodiments, a first portion of the opaque dam disposed on the front surface of the optical sensor has a first thickness, and a second portion of the opaque dam disposed on at least a portion of the front face of the substrate has a second thickness, the first thickness being less than the second thickness. In some embodiments, the first passive optical element is a lens element, the second passive optical element is a lens element, or the first and second passive optical elements are lens elements.

In another aspect, there is an optical device. The optical device includes a substrate including a front surface. The optical device includes an optical emitter chip including a front surface and a rear surface, the rear surface of the optical emitter chip affixed to the front surface of the substrate. The optical device includes an optical sensor chip including a front surface and a rear surface, the rear surface of the optical sensor chip affixed to the front surface of the substrate, the optical sensor chip further including at least one main sensor and at least one reference sensor on the front surface of the optical sensor chip. The optical device includes an opaque dam disposed on the front surface of the optical sensor chip and at least a portion of the front face of the substrate, the dam separating the main optical sensor and the reference sensor. The optical device includes a first transparent encapsulation block encapsulating the optical emitter chip and the reference optical sensor, the first transparent encapsulation block including a first passive optical element over the optical emitter chip. The optical device includes a second transparent encapsulation block encapsulating the main optical sensor, the second transparent encapsulation block including a second passive optical element over the main optical sensor. The optical device includes first opaque coating material disposed on the first transparent encapsulation block around the first passive optical element, the first opaque coating material covering substantially all of a top surface of the first transparent encapsulation block. The optical device includes second opaque coating material disposed on the second transparent encapsulation block around the second passive optical element, the second opaque coating material covering substantially all of a top surface of the second encapsulation block. The optical device includes an opaque encapsulation material encapsulating a plurality of side surfaces of the first transparent encapsulation block and encapsulating a plurality of side surfaces of the second transparent encapsulation block, wherein the opaque encapsulation material extends between the first transparent encapsulation block and the second transparent encapsulation block and abuts the opaque dam, and the opaque encapsulation material abuts the first opaque coating material along one or more edges between the top surface of the first transparent encapsulation block and the one or more side surfaces of the first transparent encapsulation block, and the opaque encapsulation material abuts the second opaque coating material along one or more edges between the top surface of the second transparent encapsulation block and the one or more side surfaces of the second transparent encapsulation block.

In some embodiments, the opaque dam further includes a channel into which the opaque encapsulation material extends. In some embodiments, the opaque encapsulation material further includes a channel into which the opaque dam extends. In some embodiments, the opaque dam is formed from a first opaque epoxy and the opaque encapsulation material is formed from a second epoxy. In some embodiments, the first opaque epoxy has a first viscosity and the second opaque epoxy has a second viscosity, the second viscosity different from the first viscosity. In some embodiments, the optical device includes at least one trench formed in the substrate, wherein the opaque encapsulation material extends into the at least one trench. In some embodiments, a thickness of the opaque dam disposed over the substrate material is greater than a second thickness of the opaque dam disposed over the optical sensor chip. In some embodiments, first passive optical element is a lens element, the second passive optical element is a lens element, or the first and second passive optical elements are lens elements.

Other aspects and advantages of the present technology will become apparent from the following detailed description, taken in conjunction with the accompanying drawings, illustrating the principles of the technology by way of example only.

BRIEF DESCRIPTION OF THE DRAWINGS

The foregoing and other objects, features, and advantages of the present technology, as well as the technology itself, will be more fully understood from the following description of various embodiments, when read together with the accompanying drawings, in which:

FIGS. 10A-10F illustrate a fabrication method for an optical device.
FIGS. 11A-11F illustrate a second fabrication method for an optical device.
FIGS. 12A-12F illustrate a third fabrication method for an optical device.

DETAILED DESCRIPTION

Figure 1:
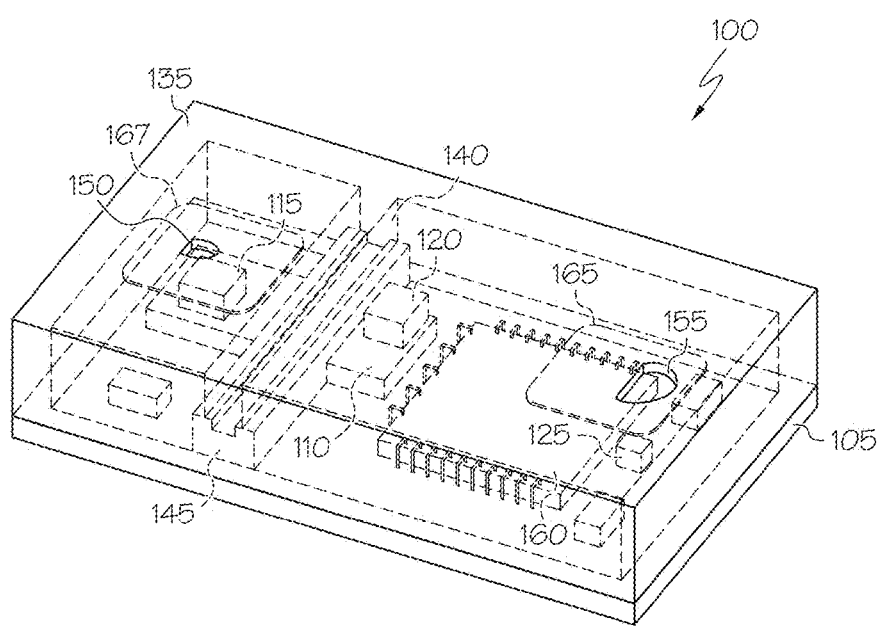
FIGS. 1-3 depict an optical device.
Figure 1A:
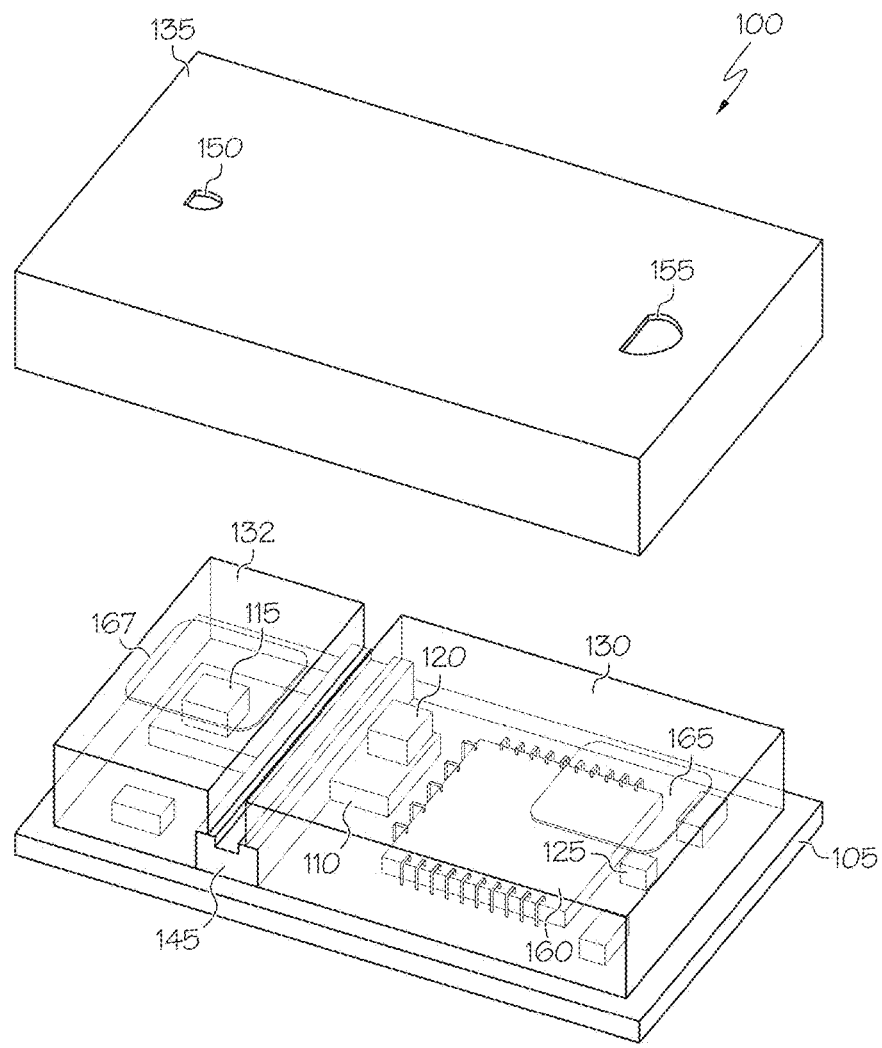
Figure 2:
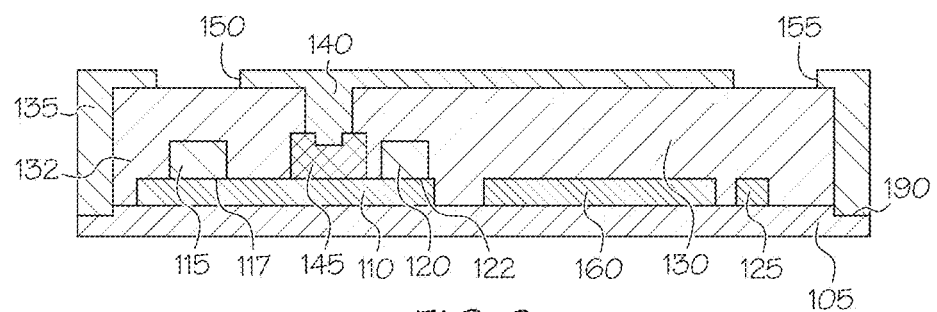
Figure 3:
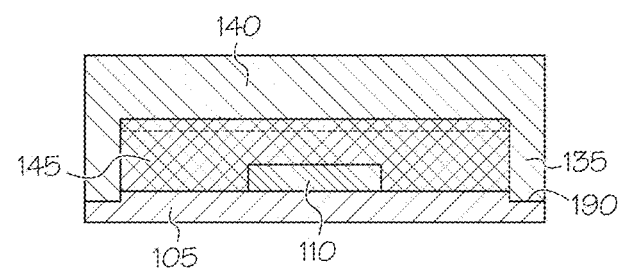

FIGS. 1-3 illustrate optical device 100. As shown in FIGS. 1-3, exemplary optical device 100 includes substrate 105. Substrate 105 can be, for example, a PCB chip. Optical sensor chip 110 is attached to the front surface of substrate 105 and can include main optical sensor 117 and reference optical sensor 122. Optical emitter chip 125 is attached to the front surface of substrate 105. Optical emitter chip 125 can be, for example, a light emitting diode (LED), infra-red (IR) LED, organic LED (OLED), infra-red (IR) laser, vertical cavity surface emitting laser (VCSEL), or other optical radiation source. Opaque dam 145 is disposed across optical device 100 on a front surface of optical sensor chip 110 and the front surface of substrate 105. Opaque dam 145 can pass between and separate main optical sensor 117 and reference optical sensor 122.

Figure 1B:
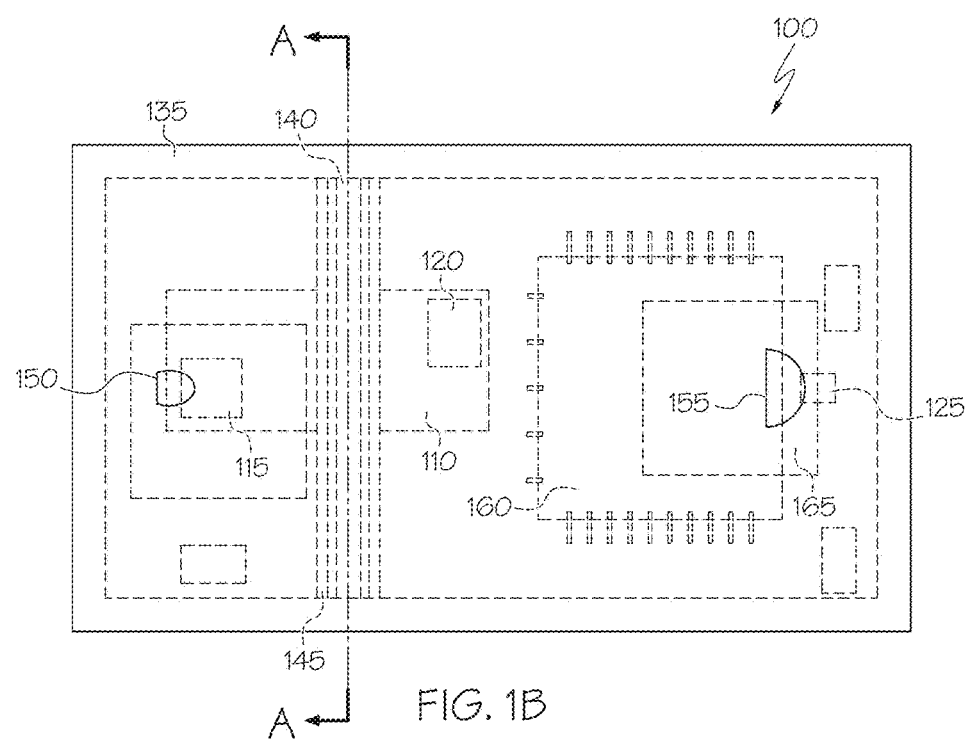

Opaque dam 145 can be integrally formed and have varying thickness. FIG. 3 illustrates a cross-sectional end view of optical device 100 and opaque dam 145 along line A-A in FIG. 1B. For example, as shown in FIG. 3, the thickness of opaque dam 145 over substrate 105 is greater than the thickness of opaque dam 145 over optical sensor chip 110. Opaque dam 145 can be substantially opaque to wavelengths of light emitted by optical emitter chip 125, in order to at least substantially interfere with or prevent light emitted from optical emitter chip 125 from passing through opaque dam 145. Opaque dam 145 can be made of, for example, an opaque epoxy.

Integrated circuit chip 160 can be attached to the front surface of substrate 105. Integrated circuit chip 160 can control emissions by optical emitter chip 125 and process information received from main optical sensor 117 and reference optical sensor 122. In some embodiments, integrated circuit chip 160 can control optical emitter chip 125 and process information received from main optical sensor 117 and reference optical sensor 122 to detect proximity between optical device 100 and an outside object.

Transparent encapsulation block 130 is disposed over and/or encapsulates optical emitter chip 125 and at least a portion of optical sensor chip 110, including reference optical sensor 122. Transparent encapsulation block 130 can be formed by, e.g., hardening or curing a liquid polymeric material or an epoxy. Transparent encapsulation block 130 can be transparent or translucent to at least particular wavelengths of light that are emitted by optical emitter chip 125. Transparent encapsulation block 132 is disposed over and/or encapsulates at least a portion of optical sensor chip 110, including main optical sensor 117. Transparent encapsulation block 132 can be formed by, e.g., hardening or curing a liquid polymeric material or an epoxy. Transparent encapsulation block 132 can be transparent or translucent to at least particular wavelengths of light that are emitted by optical emitter chip 125. In the illustrated embodiment, transparent encapsulation block 130 and transparent encapsulation block 132 are distinct from each other.

Transparent encapsulation block 130 can include polished surface 165, disposed above optical emitter chip 125. Transparent encapsulation block 132 can include polished surface 167, disposed over main optical sensor 117. Polished surfaces 165 and 167 can have a surface roughness that is less than the surface roughness of other surfaces of transparent encapsulation block 130 and transparent encapsulation block 132. Polished surfaces 165 and 167 can improve the performance of optical device 100. For example, polished surfaces 165 and 167 can reduce the scattering of incident radiation. The roughness of the other surfaces of transparent encapsulation block 130 and transparent encapsulation block 132 can facilitate better adhesion between opaque encapsulation material 135 and the surfaces of transparent encapsulation block 130 and transparent encapsulation block 132.

In some embodiments, optical device 100 can include elements for spectral modification of radiation. In the illustrated embodiment, transparent chip 115 can be placed over main optical sensor 117. Transparent chip 115 can be encapsulated in transparent encapsulation block 132. Transparent chip 115 can filter radiation to facilitate controlling the wavelengths of radiation incident on main optical sensor 117. For example, transparent chip 115 can be an infrared filter. In some embodiments, transparent chip 120 can be placed over reference optical sensor 122. Transparent chip 120 can be encapsulated in transparent encapsulation block 130. Transparent chip 120 can facilitate controlling the wavelengths of radiation incident on reference optical sensor 122, as described above with respect to transparent chip 115. In some embodiments, the optical device does not include transparent chips and spectral modification materials can be incorporated into other elements of the optical device. Spectral modification materials, e.g., filter and/or dye materials, can be included in one or more of the transparent encapsulation blocks. Spectral modification material can be sprayed, coated on, or otherwise applied to surfaces of the optical device, such as one or more surfaces of one or more of the transparent encapsulation blocks.

Opaque encapsulation material 135 encapsulates transparent encapsulation block 130 and transparent encapsulation block 132. Opaque encapsulation material 135 can form an outer layer of optical device 100, for example by extending across the top of optical device 100 and the sides of optical device 100. Opaque encapsulation material 135 includes first opening 150 disposed above main optical sensor 117 and second opening 155 disposed above optical emitter chip 125. In the illustrated embodiment, opening 155 does not extend over reference optical sensor 122. As shown in FIGS. 2 and 3, opaque encapsulation material 135 can extend beyond the front surface of substrate 105. Trench 190 can be formed in substrate 105, into which opaque encapsulation material 135 can extend. Opaque encapsulation material 135 can be, for example, an epoxy which is substantially opaque to wavelengths of light emitted by optical emitter chip 125, in order to at least substantially interfere with or prevent light emitted from optical emitter chip 125 from passing through opaque encapsulation material 135.

Opaque encapsulation material 135 can include wall portion 140. In the illustrated example, wall portion 140 is integrally formed in opaque encapsulation material 135. Wall portion 140 can extend above and abut opaque dam 145. Wall portion 140 of opaque encapsulation material 135 can be disposed between and/or divide transparent encapsulation block 130 and transparent encapsulation block 132. In some embodiments, wall portion 140 has a width that is smaller than the width of opaque dam 145.

In some embodiments, improved optical isolation between optical emitter chip 125 and main optical sensor 117 can be facilitated by, e.g., interlocking wall portion 140 opaque dam 145. In some embodiments, opaque dam 145 includes a channel disposed on a side opposite from the optical sensor chip 110. The channel of opaque dam 145 can receive a portion of wall portion 140 extending therein. In some embodiments, wall portion 140 includes a channel (not shown) that can receive a portion of opaque dam 145.

In the illustrated embodiment, opaque dam 145 and opaque encapsulation material 135 are separately formed. In some embodiments, opaque dam 145 and opaque encapsulation material 135 can be formed from the same material, such as an epoxy, having the same viscosity. In some embodiments, opaque dam 145 can be formed from a material having a higher viscosity than opaque encapsulation material 135. Use of a higher viscosity material for opaque dam 145 advantageously prevents the material from leaking on to sensitive portions of the optical sensor chip 110, such as main optical sensor 117 and reference optical sensor 122, during fabrication.

Figure 4:
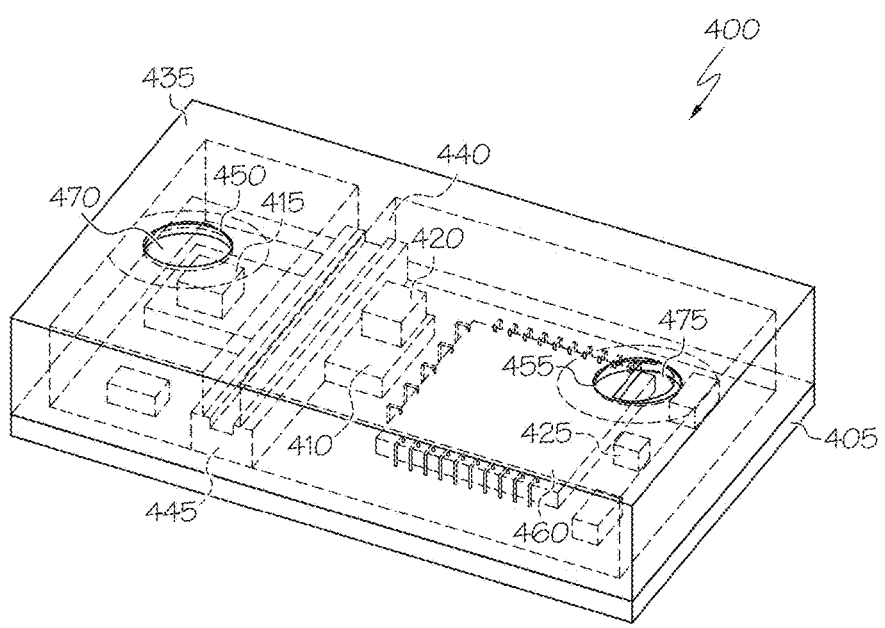
FIGS. 4-6 depict an optical device.
Figure 5:
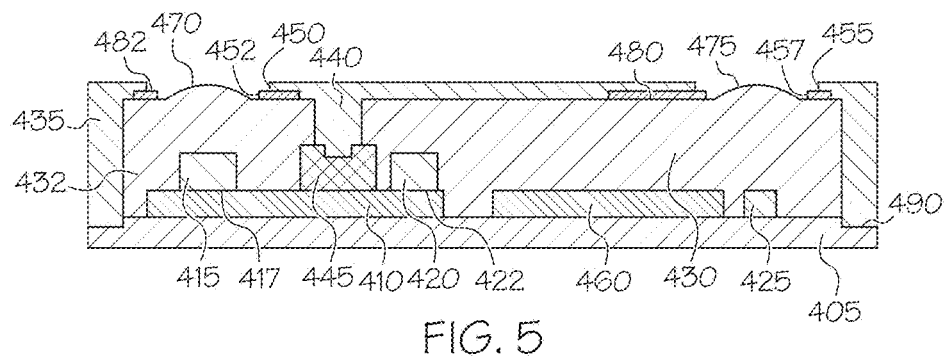
Figure 6:
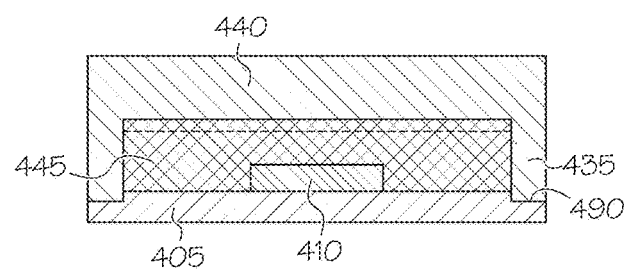

FIGS. 4-6 depict optical device 400. Optical device 400 includes substrate 405. Substrate 405 can be, for example, a PCB chip. Optical sensor chip 410 is attached to the front surface of substrate 405 and can include main optical sensor 417 and reference optical sensor 422. Optical emitter chip 425 is attached to the front surface of substrate 405. Optical emitter chip 425 can be, for example, a light emitting diode (LED), infra-red (IR) LED, organic LED (OLED), infra-red (IR) laser, vertical cavity surface emitting laser (VCSEL), or other optical radiation source. Opaque dam 445 is disposed across optical device 400 on a front surface of optical sensor chip 410 and a front surface of substrate 405. The opaque dam 445 can pass between and separate main optical sensor 417 and reference optical sensor 422.

Opaque dam 445 can be integrally formed and have varying thickness. FIG. 6 illustrates a cross-sectional end view of optical device 400 and opaque dam 445 along line B-B of FIG. 4B. For example, as shown in FIG. 6, the thickness of opaque dam 445 over substrate 405 is greater than the thickness of opaque dam 445 over optical sensor chip 410. Opaque dam 445 can be substantially opaque to wavelengths of light emitted by optical emitter chip 425, in order to at least substantially interfere with or prevent light emitted from optical emitter chip 425 from passing through opaque dam 445. Opaque dam 445 can be made of, for example, an opaque epoxy.

Integrated circuit chip 460 can be attached to the front surface of substrate 405. Integrated circuit chip 460 can control emissions by optical emitter chip 425 and process information received from main optical sensor 417 and reference optical sensor 422. In some embodiments, integrated circuit chip 460 can control optical emitter chip 425 and process information received from main optical sensor 417 and reference optical sensor 422 to detect proximity between optical device 400 and an outside object.

Transparent encapsulation block 430 is disposed over and/or encapsulates optical emitter chip 425 and at least a portion of optical sensor chip 410, including reference optical sensor 422. Transparent encapsulation block 430 can be formed by, e.g., hardening or curing a liquid polymeric material or an epoxy. Transparent encapsulation block 430 can be transparent or translucent to at least particular wavelengths of light that are emitted by optical emitter chip 425. Transparent encapsulation block 432 is disposed over and/or encapsulates at least a portion of optical sensor chip 410, including main optical sensor 417. Transparent encapsulation block 432 can be formed by, e.g., hardening or curing a liquid polymeric material or an epoxy. Transparent encapsulation block 432 can be transparent or translucent to at least particular wavelengths of light that are emitted by optical emitter chip 425. In the illustrated embodiment, transparent encapsulation block 430 and transparent encapsulation block 432 are distinct from each other.

In some embodiments, transparent chip 415 may be placed over main optical sensor 417. Transparent chip 415 can be encapsulated in transparent encapsulation block 432. Transparent chip 415 can filter radiation to facilitate controlling the wavelengths of radiation incident on main optical sensor 417. For example, transparent chip 415 can be an infrared filter. In some embodiments, transparent chip 420 can be placed over reference optical sensor 422. Transparent chip 420 can be encapsulated in transparent encapsulation block 430. Transparent chip 420 can facilitate controlling wavelengths of radiation incident on reference optical sensor 422 as described above with respect to transparent chip 415.

In other embodiments, transparent encapsulation blocks 430 and/or 432 can include passive optical elements. Passive optical elements can be integral with or distinct from transparent encapsulation blocks 430 or 432. Passive optical elements can be formed from the same material as transparent encapsulation blocks 430 or 432. For example, passive optical elements can be lens elements. As depicted in FIGS. 4-6, lens elements 470 and/or 475 can be disposed opposite from substrate 405. Lens elements 470 and/or 475 can be configured to modify a property of light entering or exiting optical device 400, including, for instance, by refraction, diffraction, or by partially refracting and diffracting light. Lens elements can be associated with particular elements of optical device 400. As illustrated in, for example, FIG. 5, lens element 470 can be disposed above main optical sensor 417. Lens element 475 can be configured to modify a property of light passing through lens element 470. Lens element 475 can be disposed above optical emitter chip 425. Lens element 475 can be configured to modify a property of light passing through lens element 475 in the same or a different manner than the modification performed by lens element 470.

Figure 4A:
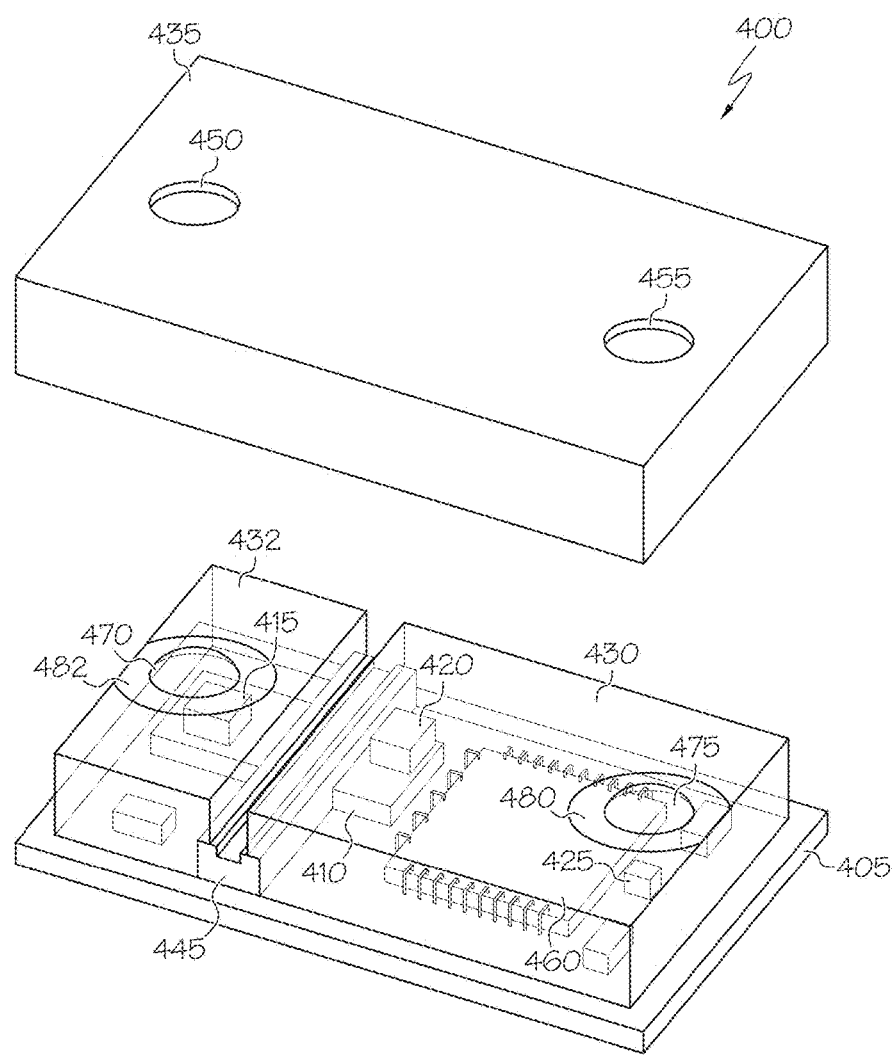
Figure 4B:
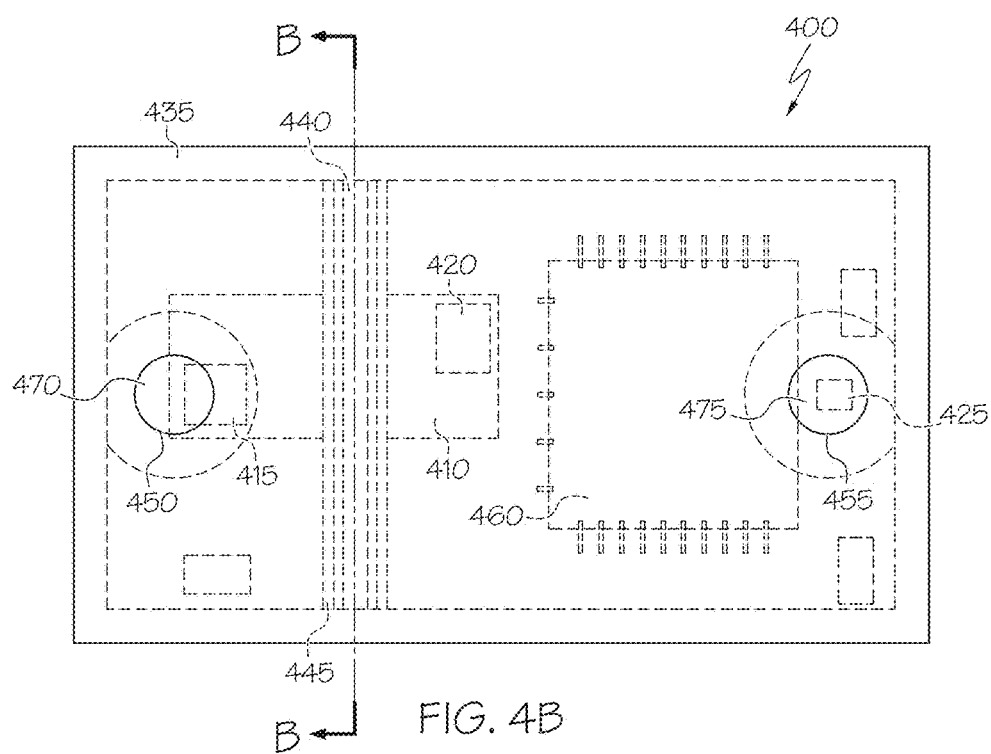

As shown in FIGS. 4A and 5, opaque coating 480 can be applied to a surface of transparent encapsulation block 430 (e.g., in an annular shape around lens element 475). Opaque coating 480 can define opening 452. For example, opaque coating 480 can form an apron around passive optical elements on the surface of transparent encapsulation block 430. Opaque coating 482 can be applied to a surface of transparent encapsulation block 432 (e.g., in an annular shape around lens element 470). Opaque coating 482 can define an opening 457. For example, opaque coating 482 can form an apron around passive optical elements on the surface of transparent encapsulation block 432. Opaque coating 480 and opaque coating 482 can be substantially opaque to wavelengths of light emitted by optical emitter chip 425, in order to at least substantially interfere with or prevent light emitted from optical emitter chip 425 from passing through opaque coating 480 or opaque coating 482. Opaque coating 480 and opaque coating 482 can be substantially opaque to wavelengths of light detectable by main optical sensor 417 or reference optical sensor 422. Opaque coating 480 and opaque coating 482 can be constructed using, for example, a photostructurable material such as, e.g., a resist or photoresist material. Opaque coating 480 and 482 can be applied with high accuracy to facilitate accurate construction of optical device 400. For example, the application of opaque coating 480 and opaque coating 482 can be controlled to prevent undesired contamination of passive optical elements of optical device 400.

Opaque encapsulation material 435 encapsulates transparent encapsulation block 430 and transparent encapsulation block 432. Opaque encapsulation material 435 can form an outer layer of optical device 400, for example by extending across the top of optical device 400 and the sides of optical device 400. Opaque encapsulation material 435 includes first opening 450 disposed above opening 452 and main optical sensor 417. Opaque encapsulation material 435 includes second opening 455 disposed above opening 457 and optical emitter chip 425. In the illustrated embodiment, opening 455 does not extend over reference optical sensor 422. As shown in FIGS. 5 and 6, opaque encapsulation material 435 can extend beyond a front surface of substrate 405. Trench 490 can be formed in substrate 405 into which opaque encapsulation material 435 can extend. Opaque encapsulation material 435 can be, for example, an epoxy which is substantially opaque to wavelengths of light emitted by optical emitter chip 425, in order to at least substantially interfere with or prevent light emitted from optical emitter chip 425 from passing through opaque encapsulation material 435. In some embodiments, the optical device does not include transparent chips and spectral modification materials can be incorporated into other elements of the optical device. Spectral modification materials, e.g., filter and/or dye materials, can be included in one or more of the transparent encapsulation blocks. Spectral modification material can be sprayed, coated on, or otherwise applied to surfaces of the optical device, such as one or more surfaces of one or more of the transparent encapsulation blocks.

In some embodiments, opaque encapsulation material 435 at least partially encapsulates opaque coating 480 or opaque coating 482. Opaque encapsulation material 435 can be disposed on a top surface of opaque coating 480 which is opposite from the surface of opaque coating 480 disposed on the surface of transparent encapsulation block 430. Opaque encapsulation material 435 can be partially disposed on a top surface of opaque coating 482 which is opposite from the surface of opaque coating 482 disposed on the surface of transparent encapsulation block 432. Opaque encapsulation material 435 can at least partially overlap opaque coating 480 or opaque coating 482.

Opaque encapsulation material 435 can include wall portion 440. In the illustrated example, wall portion 440 is integrally formed in opaque encapsulation material 435. Wall portion 440 can extend above and abut opaque dam 445. Wall portion 440 of opaque encapsulation material 435 can be disposed between and/or divide transparent encapsulation block 430 and transparent encapsulation block 432. In some embodiments, wall portion 440 has a width that is smaller than the width of opaque dam 445.

In some embodiments, improved optical isolation between optical emitter chip 425 and main optical sensor 417 can be facilitated by, e.g., interlocking wall portion 440 opaque dam 445. In some embodiments, opaque dam 445 includes a channel disposed on a side opposite from the optical sensor chip 410. The channel of opaque dam 445 can receive a portion of wall portion 440 extending therein. In some embodiments, wall portion 440 includes a channel (not shown) that can receive a portion of opaque dam 445.

In the illustrated embodiment, opaque dam 445 and opaque encapsulation material 435 are separately formed. In some embodiments, opaque dam 445 and opaque encapsulation material 435 can be formed from the same material, such as an epoxy, having the same viscosity. In some embodiments, opaque dam 445 can be formed from a material having a higher viscosity than opaque encapsulation material 435. Use of a higher viscosity material for opaque dam 445 advantageously prevents the material from leaking on to sensitive portions of optical sensor chip 410, such as main optical sensor 417 and reference optical sensor 422, during fabrication.

Figure 7:
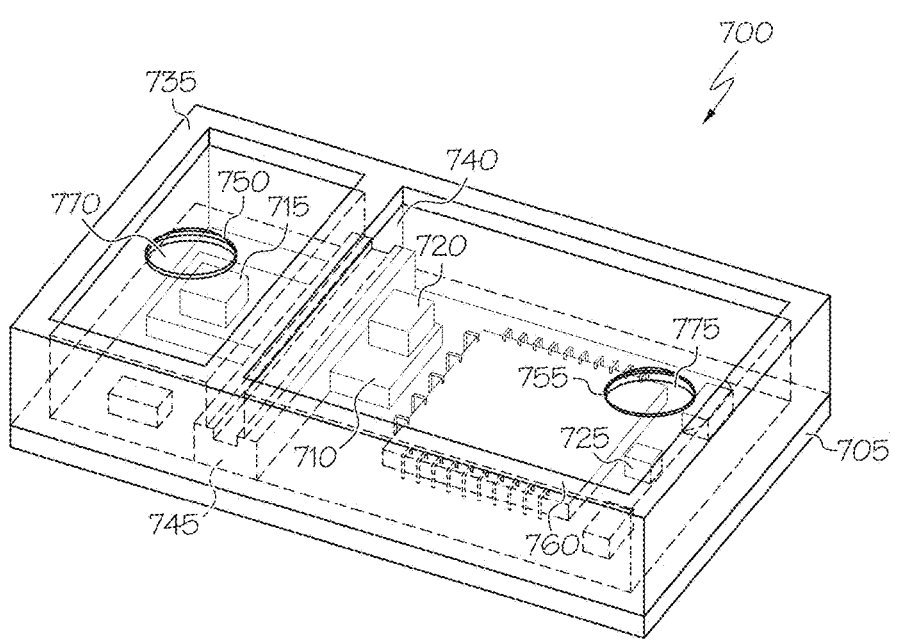
FIGS. 7-9 depict an optical device.
Figure 7A:
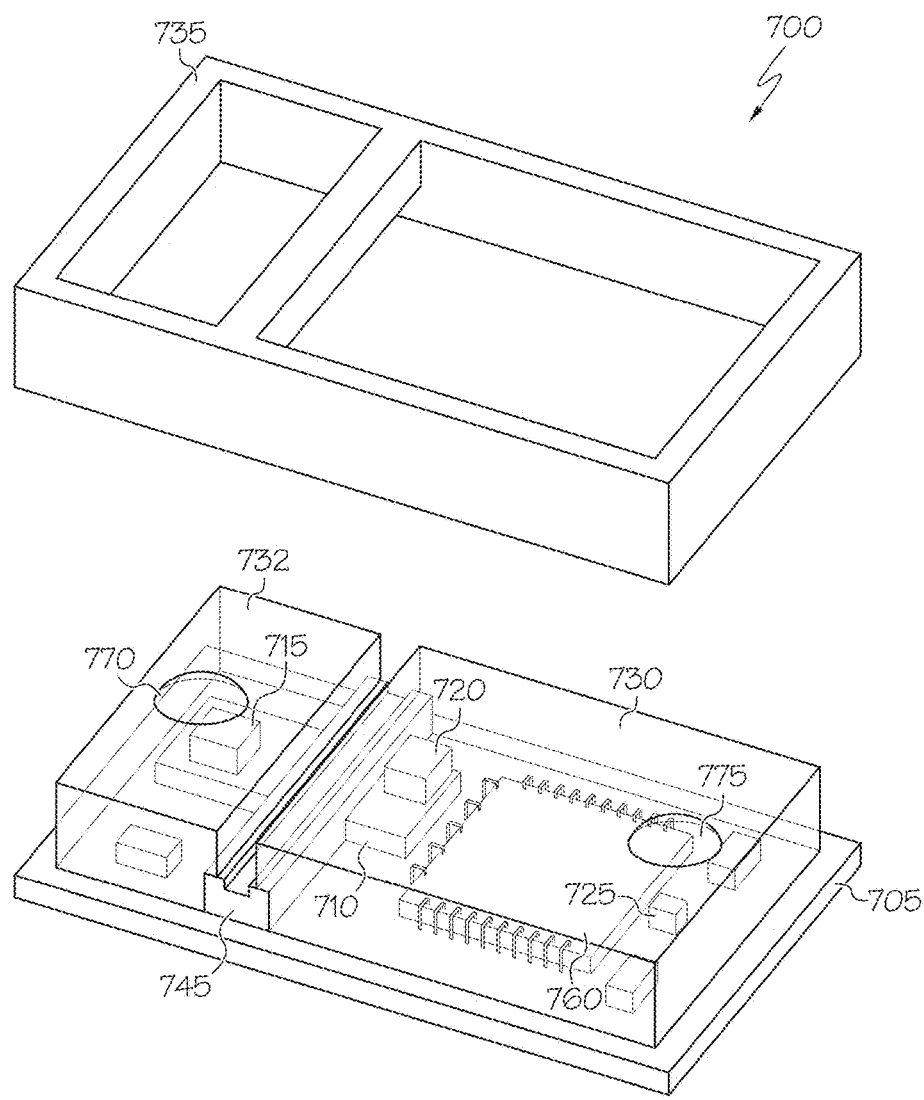
Figure 8:
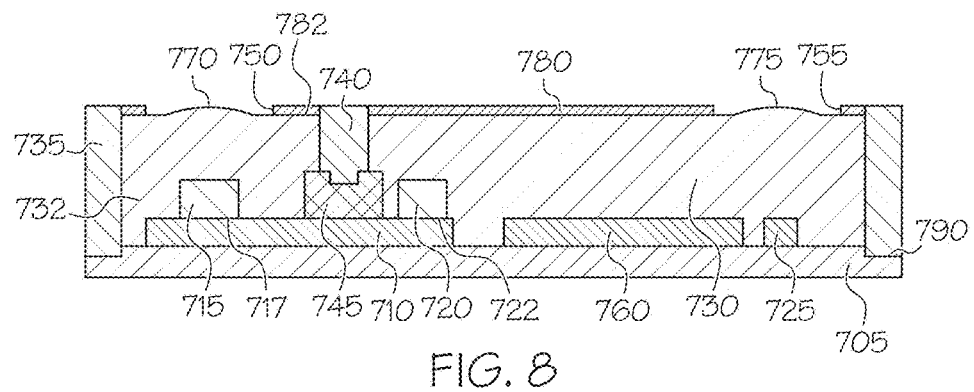
Figure 9:
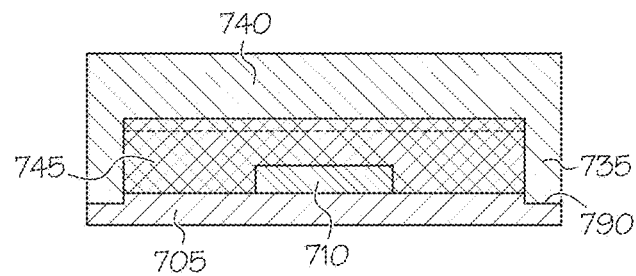

FIGS. 7-9 depict an optical device. Optical device 700 can include substrate 705. Substrate 705 can be, for example, a PCB chip. Optical sensor chip 710 is attached to the front surface of substrate 705 and can include main optical sensor 717 and reference optical sensor 722. Optical emitter chip 725 is attached to a front surface of substrate 705. Optical emitter chip 725 can be, for example, a light emitting diode (LED), infra-red (IR) LED, organic LED (OLED), infra-red (IR) laser, vertical cavity surface emitting laser (VCSEL), or other optical radiation source. Opaque dam 745 is disposed across optical device 700 on a front surface of optical sensor chip 710 and a front surface of substrate 705. Opaque dam 745 can pass between and separate main optical sensor 717 and reference optical sensor 722.

Figure 7B:
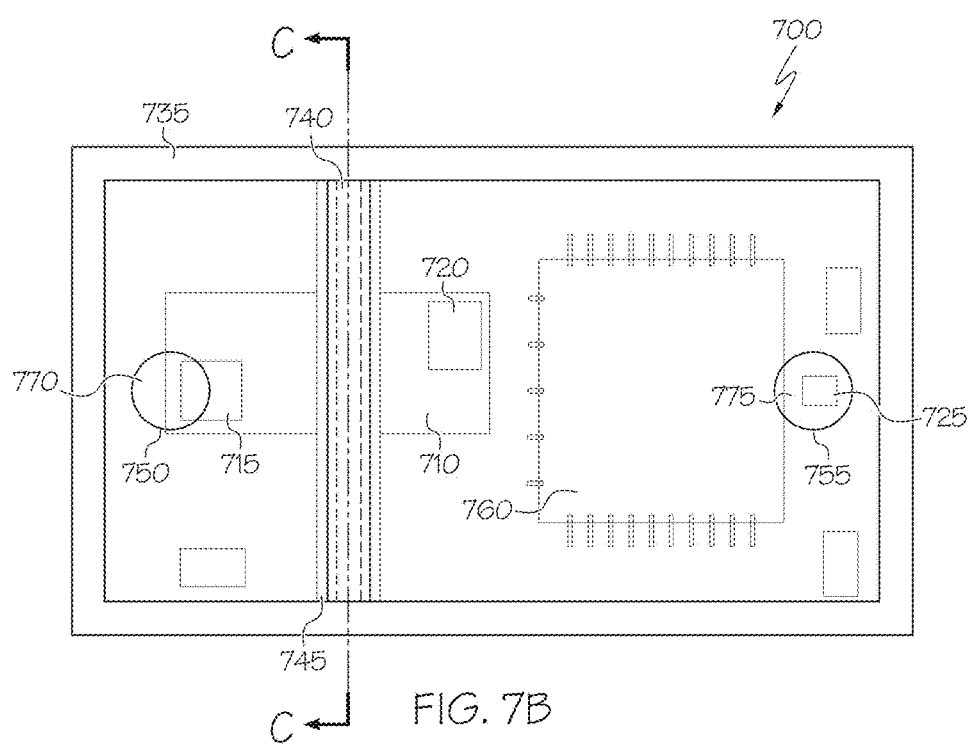

Opaque dam 745 can be integrally formed and have varying thickness. FIG. 9 illustrates a cross-sectional end view of optical device 700 and opaque dam 745 along line C-C of FIG. 7B. For example, as shown in FIG. 9, the thickness of opaque dam 745 over substrate 705 is greater than the thickness of opaque dam 745 over optical sensor chip 710. Opaque dam 745 can be substantially opaque to wavelengths of light emitted by optical emitter chip 725, in order to at least substantially interfere with or prevent light emitted from optical emitter chip 725 from passing through opaque dam 745. Opaque dam 745 can be made of, for example, an opaque epoxy.

Integrated circuit chip 760 can be attached to the front surface of substrate 705. Integrated circuit chip 760 can control emissions by optical emitter chip 725 and process information received from main optical sensor 717 and reference optical sensor 722. In some embodiments, integrated circuit chip 760 can control optical emitter chip 725 and process information received from main optical sensor 717 and reference optical sensor 722 to detect proximity between optical device 700 and an outside object.

Transparent encapsulation block 730 is disposed over and/or encapsulates optical emitter chip 725 and at least a portion of optical sensor chip 710, including reference optical sensor 722. Transparent encapsulation block 730 can be formed by, e.g., hardening or curing a liquid polymeric material or an epoxy. Transparent encapsulation block 730 can be transparent or translucent to at least particular wavelengths of light that are emitted by optical emitter chip 725. Transparent encapsulation block 732 is disposed over and/or encapsulates at least a portion of optical sensor chip 710, including main optical sensor 117. Transparent encapsulation block 732 can be formed by, e.g., hardening or curing a liquid polymeric material or an epoxy. Transparent encapsulation block 732 can be transparent or translucent to at least particular wavelengths of light that are emitted by optical emitter chip 725. In the illustrated embodiment, transparent encapsulation block 730 and transparent encapsulation block 732 are distinct from each other.

In some embodiments, transparent chip 715 may be placed over main optical sensor 717. Transparent chip 715 can be encapsulated in transparent encapsulation block 732. Transparent chip 715 can filter radiation to facilitate controlling the wavelengths of radiation incident on main optical sensor 717. For example, transparent chip 715 can be an infrared filter. In some embodiments, transparent chip 720 can be placed over reference optical sensor 722. Transparent chip 720 can be encapsulated in transparent encapsulation block 730. Transparent chip 720 can facilitate controlling wavelengths of radiation incident on reference optical sensor 722 as described above with respect to transparent chip 715. In some embodiments, the optical device does not include transparent chips and spectral modification materials can be incorporated into other elements of the optical device. Spectral modification materials, e.g., filter and/or dye materials, can be included in one or more of the transparent encapsulation blocks. Spectral modification material can be sprayed, coated on, or otherwise applied to surfaces of the optical device, such as one or more surfaces of one or more of the transparent encapsulation blocks.

Transparent encapsulation block 730 can include passive optical elements. Passive optical elements can be integral with or distinct from transparent encapsulation materials 730 or 732. For example, passive optical elements can be lens elements 770 and 775. Lens element 770 can be disposed above main optical sensor 717. Lens element 775 can be disposed above optical emitter chip 725. Other characteristics of lens elements 770 and 775 can be similar to those discussed for lens elements 470 and 475 in FIGS. 4-6.

Opaque coating 780 can be disposed on the surface of transparent encapsulation block 730. Opaque coating 782 can be disposed on the surface of transparent encapsulation block 732. Opaque coating 780 and opaque coating 782 are substantially opaque to wavelengths of light emitted by optical emitter chip 725, in order to at least substantially interfere with or prevent light emitted from optical emitter chip 725 from passing through opaque coating 780 and/or opaque coating 782. Opaque coating 780 and/or opaque coating 782 can be substantially opaque to wavelengths of light detectable by main optical sensor 717 or reference optical sensor 722. Opaque coating 780 or 782 can be constructed using, for example, a photostructurable material such as, e.g., a resist or photoresist material. Opaque coating 780 and opaque coating 782 can be applied with high accuracy to facilitate accurate construction of optical device 700. For example, the application of opaque coating 780 and opaque coating 782 can be controlled to prevent undesired contamination of passive optical elements of optical device 700.

As depicted in FIG. 8, opaque encapsulation material 735 can be disposed on the sides of optical device 700. Opaque encapsulation material 735 can be configured to optically isolate transparent encapsulation block 730 and transparent encapsulation block 732 on at least one side from wavelengths of light that are detectable by, for example, main optical sensor 717. Opaque encapsulation material 735 can be, for example, an epoxy which is substantially opaque to wavelengths of light emitted by optical emitter chip 725, in order to at least substantially interfere with or prevent light emitted from optical emitter chip 725 from passing through opaque encapsulation material 735.

Opaque encapsulation material 735 can encapsulate a plurality of side surfaces of transparent encapsulation block 730 and can encapsulate a plurality of side surfaces of transparent encapsulation block 732. In some embodiments, opaque encapsulation material can encapsulate a plurality of side surfaces of transparent block 730 and can encapsulate a plurality of side surfaces of transparent encapsulation block 732.

In some embodiments, opaque encapsulation material 735 can include wall portion 740. Wall portion 740 can extend above and abut opaque dam 745. Wall portion 740 can be disposed between and or divide transparent encapsulation block 730 and transparent encapsulation block 732. In some embodiments, wall portion 740 has a width that is smaller than the width of opaque dam 745.

In some embodiments, opaque encapsulation material 735 can be in contact with opaque coating 780 and/or opaque coating 782 to facilitate light tightness. In some embodiments, opaque encapsulation material 735 abuts opaque coating 780 along one or more edges between the top surface of transparent encapsulation block 730 and the one or more side surfaces of transparent encapsulation block 730. In some embodiments, opaque encapsulation material 735 and/or wall portion 740 abut opaque coating 782 along one or more edges between the top surface of transparent encapsulation block 732 and the one or more side surfaces of transparent encapsulation block 732.

In some embodiments, improved optical isolation between optical emitter chip 725 and main optical sensor 717 can be facilitated by, e.g., interlocking wall portion 740 opaque dam 745. In some embodiments, opaque dam 745 includes a channel disposed on a side opposite from the optical sensor chip 710. The channel of opaque dam 745 can receive a portion of wall portion 740 extending therein. In some embodiments, wall portion 740 includes a channel (not shown) that can receive a portion of opaque dam 745.

In the illustrated embodiment, opaque dam 745 and opaque encapsulation material 735 are separately formed. In some embodiments, opaque dam 745 and wall portion 740 can be formed from the same material, such as an epoxy, having the same viscosity. In some embodiments, opaque dam 745 can be formed from a material having a higher viscosity than wall portion 740. Use of a higher viscosity material for opaque dam 745 advantageously prevents the material from leaking on to sensitive portions of optical sensor chip 710, such as main optical sensor 717 and reference optical sensor 722, during fabrication.

The optical modules described above can be fabricated by various techniques, examples of which are described below.

Figure 10C:
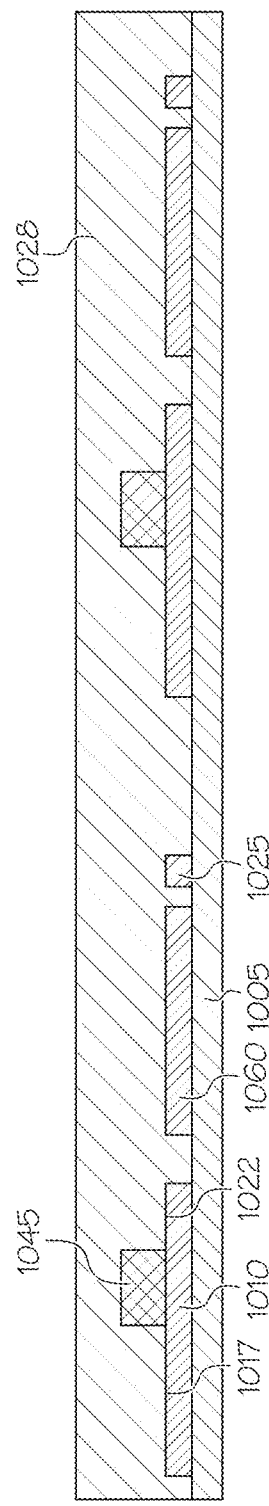

FIGS. 10A-10F illustrate a fabrication method for an optical device. As shown in FIG. 10A, a plurality of optical components are provided on the front surface of substrate 1005. In some methods, optical sensor chip 1010, integrated circuit chip 1060, and optical emitter chip 1025 can be provided on the front surface of substrate 1005.

Opaque dam 1045 is dispensed on the front surface of optical sensor chip 1010 substrate 1005, passing between and separating main optical sensor 1017 and reference optical sensor 1022. In some methods, opaque dam 1045 is dispensed using an applicator such as, e.g., a syringe. The thickness of opaque dam 1045 over substrate 1005 is greater than the thickness of opaque dam 1045 over optical sensor chip 1010. According to some methods, the thickness of opaque dam 1045 can be controlled during fabrication by controlling the rate of application of the dam material. According to some methods, the thickness of opaque dam 1045 can be controlled by slowing or stopping the applicator over a particular region, for example, substrate 1005, such that an increased volume of opaque dam material is deposited. Opaque dam 1045 can be made of, for example, an opaque epoxy. Opaque dam 1045 can then be hardened or cured. Curing can be accomplished, for example, by applying energy to the material, e.g., in the form of heat and/or radiation.

Transparent encapsulation material 1028 is dispensed over the front surface of 1005 and optical components thereon. As depicted in FIG. 10C, transparent encapsulation material 1028 encapsulates exposed portions of substrate 1005, optical sensor chip 1010, opaque dam 1045, integrated circuit chip 1060, and optical emitter 1025. Prior to the application of transparent encapsulation material 1028, transparent chips, such as, e.g. the components associated with reference numerals 115 and 120 in FIG. 1, can be optionally placed on top of main optical sensor 1017 and/or reference optical sensor 1022. Transparent encapsulation material 1028 can be, e.g., a liquid polymeric material or an epoxy, which is transparent or translucent to at least particular wavelengths of light that are emitted by optical emitter chip 1025. Transparent encapsulation material 1028 can be cured, for example, by applying energy to the material, e.g., in the form of heat and/or radiation.

Figure 10D:
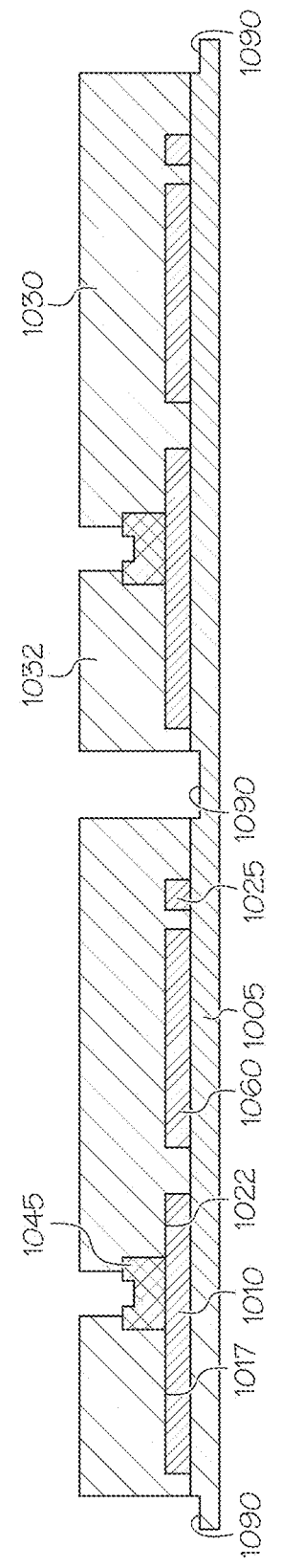

As depicted in FIG. 10D, portions of cured transparent encapsulation material 1028 are removed, forming grooves. Removal of portions of transparent encapsulation material 1028 can be accomplished, for instance, by a dicing process, using, e.g., a dicing saw. The dimensions of the portions of cured transparent encapsulation material 1028 removed can be controlled, for example, by adjusting the depth by which blades of the dicing saw cut, or adjusting the width of the saw blade. According to some methods, dicing can remove a portion of substrate 1005, forming a trench 1090. Dicing can also remove a portion of opaque dam 1045, creating a channel disposed in opaque dam 1045 on a side opposite from optical sensor chip 1010. Dicing should not cut through opaque dam 1045, because damage to optical sensor chip 1010 would result. In this manner, opaque dam 1045 can act as a protective layer over optical sensor chip 1010 during the dicing process. The dicing process can define transparent encapsulation block 1030 and transparent encapsulation block 1032, with grooves disposed between.

Opaque encapsulation material 1035 is applied to outer surfaces of transparent encapsulation block 1030 and transparent encapsulation block 1032. Opaque encapsulation material 1035 can form an outer layer on the surface of transparent encapsulation block 1030 and transparent encapsulation block 1032. During application, opaque encapsulation material 1035 fills the grooves between transparent encapsulation block 1030 and transparent encapsulation block 1032 formed during the dicing process. According to some methods, where the dicing process has formed a channel in opaque dam 1045, opaque encapsulation material 1035 extends into and fills the channel. In this manner, a light tight barrier can be formed between transparent encapsulation block 1030 and transparent encapsulation block 1032. In some methods, where the dicing process has formed trench 1090 in substrate 1005, opaque encapsulation material 1035 substantially fills trench 1090, facilitating a light tight interface. Opaque encapsulation material 1035 can be, for example, an epoxy which is substantially opaque to wavelengths of light emitted by optical emitter chip 1025, in order to at least substantially interfere with or prevent light emitted from optical emitter chip 1025 from passing through opaque encapsulation material 1035.

According to FIG. 10F, substrate 1005 can be singulated to produce singulated optical device 1000. Singulation can be accomplished by means of dicing, e.g., using a dicing saw. In some methods, singulation can be accomplished by, e.g., laser cutting. Singulation can be accomplished by dicing completely through substrate 1005 and the portion of opaque encapsulation material 1035 disposed above and abutting substrate 1005.

Figure 11E:
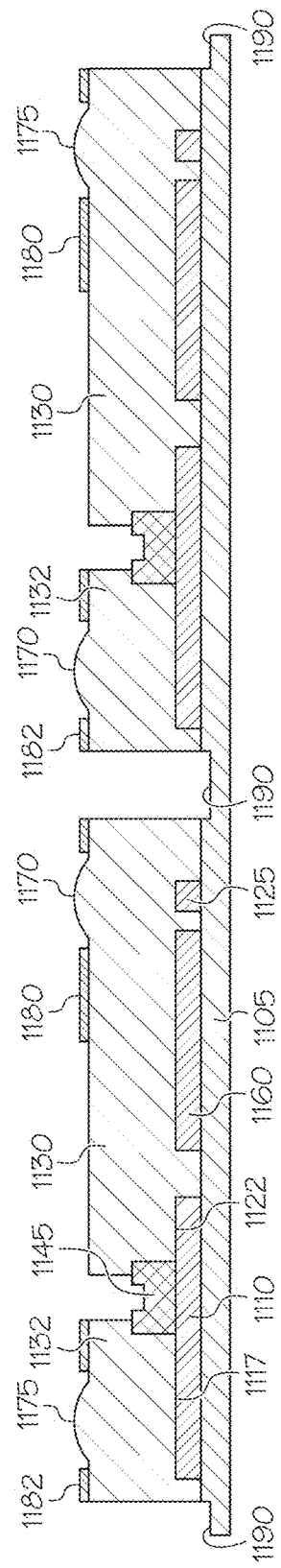
Figure 11F:
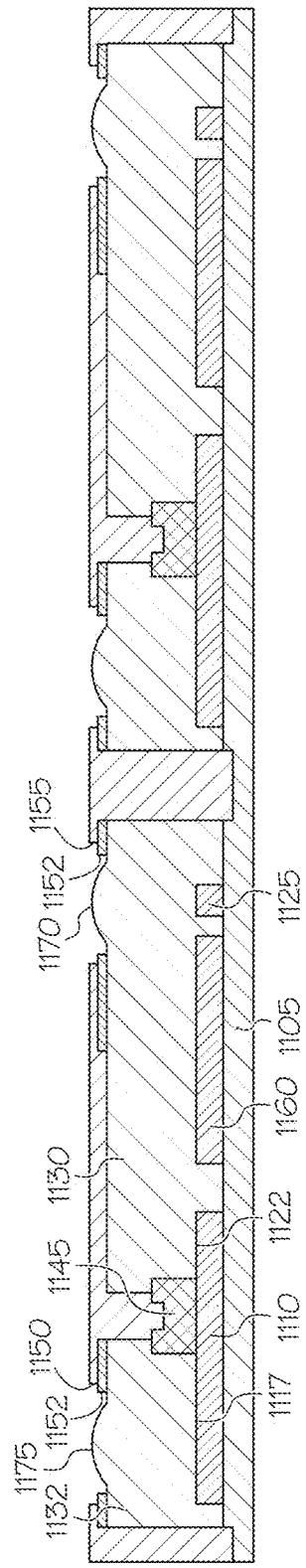

A second fabrication method for an optical device is illustrated in FIGS. 11A-11F. As shown in FIG. 11A, a plurality of optical components are provided on the front surface of substrate 1105. In some methods, optical sensor chip 1110, integrated circuit chip 1160, and optical emitter chip 1125 can be provided on the front surface of substrate 1105.

Opaque dam 1145 is dispensed on the front surface of optical sensor chip 1110 and substrate 1105, passing between and separating main optical sensor 1117 and reference optical sensor 1122. In some methods, opaque dam 1145 is dispensed using an applicator such as, e.g., a syringe. The thickness of opaque dam 1145 over substrate 1105 is greater than the thickness of opaque dam 1145 over optical sensor chip 1110. According to some methods, the thickness of opaque dam 1145 can be controlled by controlling the rate of application of the dam material. According to some methods, the thickness of opaque dam 1145 can be controlled by slowing or stopping the applicator over a particular region, for example, substrate 1105, such that an increased volume of opaque dam material is deposited. Opaque dam 1145 can be made of, for example, an opaque epoxy. Opaque dam 1145 can then be hardened or cured. Curing can be accomplished, for example, by applying energy to the material, e.g., in the form of heat and/or radiation.

Transparent encapsulation material 1128 is dispensed over the front surface of 1105 and optical components thereon. As depicted in FIG. 11C, transparent encapsulation encapsulates exposed portions of substrate 1105, optical sensor chip 1110, opaque dam 1145, integrated circuit chip 1160, an optical emitter 1125. Prior to the application of transparent encapsulation material, transparent chips, such as, e.g. the components associated with reference numerals 415 and 420 in FIG. 4, may be placed on top of main optical sensor 1117 and/or reference optical sensor 1122. Transparent encapsulation material 1128 can be, e.g., a liquid polymeric material or an epoxy, which is transparent or translucent to at least particular wavelengths of light that are emitted by optical emitter chip 1125. Passive optical elements may be integrally or non-integrally formed from transparent encapsulation material 1128. For example, passive optical elements can be lens elements 1170 and/or 1175. In some methods, lens elements 1170 and/or 1175 can be shaped by means of a replication tool such as, e.g., by a mold. Transparent encapsulation material 1128 can be cured, for example, by applying energy to the material, e.g., in the form of heat and/or radiation.

Opaque coatings 1180 and 1182 are applied to the surfaces of transparent encapsulation material 1128. According to some embodiments, opaque coating 1180 and 1182 can be applied such that opaque coating 1180 forms an apron around lens element 1170. Opaque coating 1182 can be applied to form an apron around lens element 1175. Opaque coating material 1180 and/or 1182 can be a photostructurable material such as, e.g., a resist or photoresist material that is substantially opaque to wavelengths of light emitted by optical emitter chip 1125, in order to at least substantially interfere with or prevent light emitted from optical emitter chip 1125 from passing through opaque coating 1180 or 1182. Opaque coating 1180 and 1182 can be applied by various methods, including, e.g. spray coating or spin coating. The methods used to apply opaque coatings 1180 and 1182 can be very precise and advantageously increase accurate construction. After application, opaque coating 1180 and 1182 can be developed using, for example, selective illumination means such as laser direct imaging (LDI) or using a mask.

As depicted in FIG. 11E, portions of cured transparent encapsulation material 1128 are removed, forming grooves. Removal of portions of transparent encapsulation material 1128 can be accomplished, for instance, by a dicing process, using, e.g., a dicing saw. The dimensions of the portions of cured transparent encapsulation material 1128 removed can be controlled, for example, by adjusting the depth by which blades of the dicing saw cut, or adjusting the width of the saw blade. According to some methods, dicing can remove a portion of substrate 1105, forming trench 1190. Dicing can also remove a portion of opaque dam 1145, creating a channel disposed in opaque dam 1145 on a side opposite from optical sensor chip 1110. Dicing should not cut through opaque dam 1145, because damage to optical sensor chip 1110 would result. In this manner, opaque dam 1145 can act as a protective layer over optical sensor chip 1110 during the dicing process. The dicing process can define transparent encapsulation block 1130 and transparent encapsulation block 1132, with grooves between the blocks.

Opaque encapsulation material 1135 is applied to outer surfaces of transparent encapsulation block 1130 and transparent encapsulation block 1132. Opaque encapsulation material 1135 can be dispensed across the top and on the sides of transparent encapsulation block 1130 and transparent encapsulation block 1132. During application, opaque encapsulation material 1135 fills the grooves between transparent encapsulation block 1130 and transparent encapsulation block 1132 formed during the dicing process. According to some methods, where the dicing process has formed a channel in opaque dam 1145, opaque encapsulation material 1135 extends into and fills the channel. In this manner, a light tight barrier can be formed between transparent encapsulation block 1130 and transparent encapsulation block 1132. In some methods, where the dicing process has formed trench 1190 in substrate 1105, opaque encapsulation material 1135 substantially fills trench 1190, facilitating a light tight interface. Opaque encapsulation material 1135 can be, for example, an epoxy which is substantially opaque to wavelengths of light emitted by optical emitter chip 1125, in order to at least substantially interfere with or prevent light emitted from optical emitter chip 1125 from passing through opaque encapsulation material 1135.

According to some embodiments, opaque encapsulation material 1135 can be applied to an outer surface of at least a part of opaque coating 1180 or 1182. Opaque encapsulation material 1135 can be applied to encapsulate at least a portion of opaque coating 1180 or 1182. In some embodiments, opaque encapsulation material can at least partially overlap opaque coating 1180 or 1182.

In another step, substrate 1105 can be singulated according to the method described with reference to FIG. 10F.

Figure 12A:
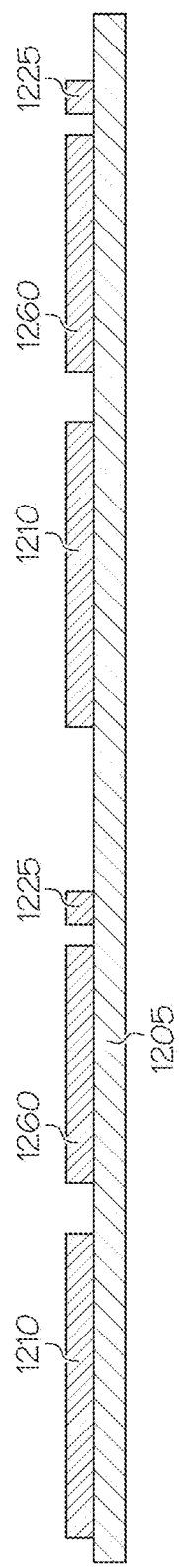
Figure 12B:
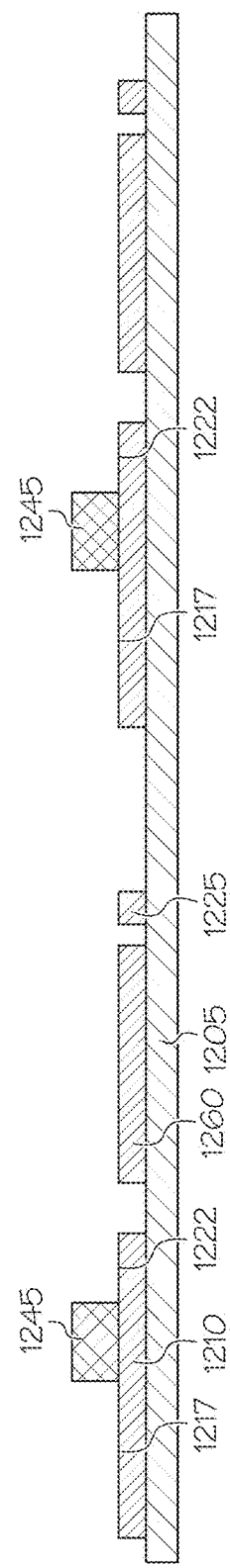

FIGS. 12A-12F illustrate a third fabrication method for an optical device. As shown in FIG. 12A, a plurality of optical components are provided on the front surface of substrate 1205. In some methods, optical sensor chip 1210, integrated circuit chip 1260, and optical emitter chip 1225 can be provided on the front surface of substrate 1205.

Opaque dam 1245 is dispensed on the front surface of optical sensor chip 1210 substrate 1205, passing between and separating main optical sensor 1217 and reference optical sensor 1222. In some methods, opaque dam 1245 is dispensed using an applicator such as, e.g., a syringe. The thickness of opaque dam 1245 over substrate 1205 is greater than the thickness of opaque dam 1245 over optical sensor chip 1210. According to some methods, the thickness of opaque dam 1245 can be controlled by controlling the rate of application of the dam material. According to some methods, the thickness of opaque dam 1245 can be controlled by slowing or stopping the applicator over a particular region, for example, substrate 1205, such that an increased volume of opaque dam material is deposited. Opaque dam 1245 can be made of, for example, an opaque epoxy. Opaque dam 1245 can then be hardened or cured. Curing can be accomplished, for example, by applying energy to the material, e.g., in the form of heat and/or radiation.

Figure 12C:
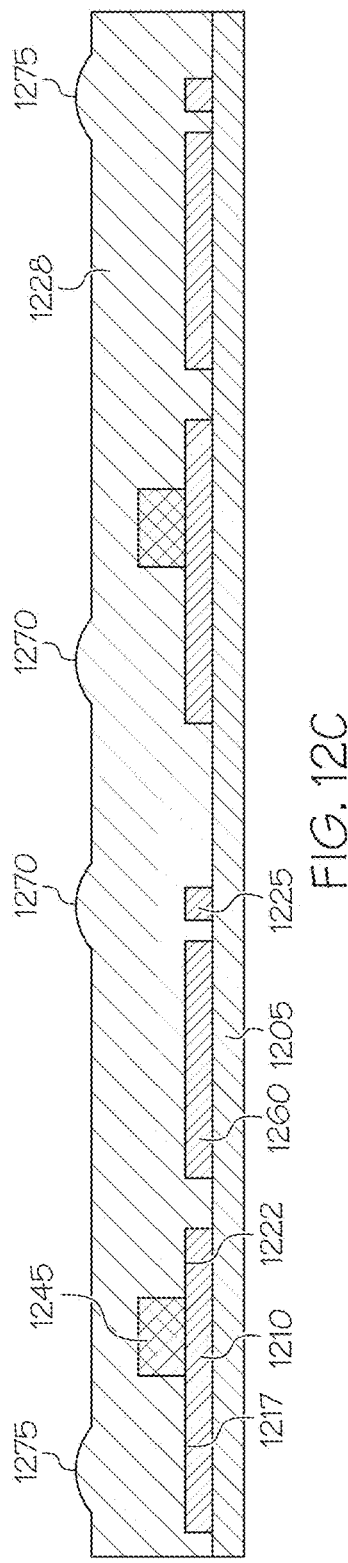
Figure 12D:
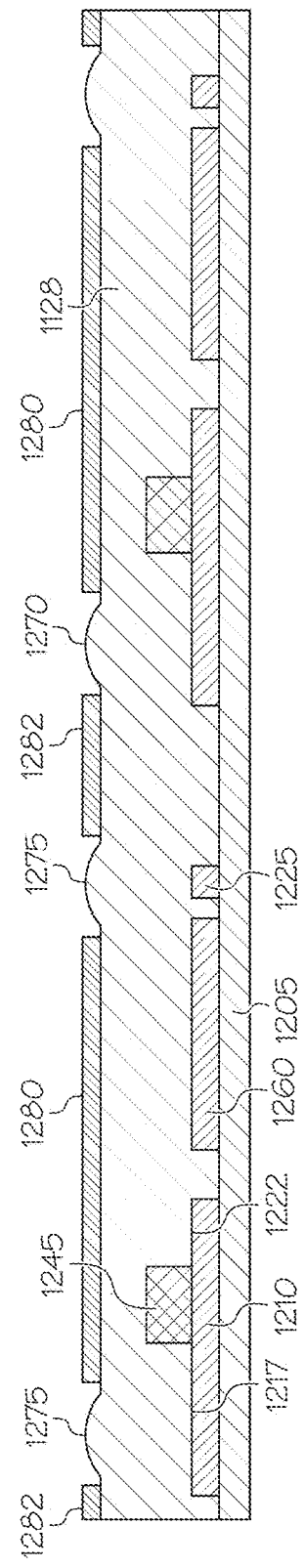

Transparent encapsulation material 1228 is dispensed over the front surface of 1205 and optical components thereon. As depicted in FIG. 12C, transparent encapsulation encapsulates exposed portions of substrate 1205, optical sensor chip 1210, opaque dam 1245, integrated circuit chip 1260, an optical emitter 1225. Prior to the application of transparent encapsulation material, transparent chips, such as, e.g. the components associated with reference numerals 715 and 720 in FIG. 7, may be placed on top of main optical sensor 1217 and/or reference optical sensor 1222. Transparent encapsulation material 1228 can be, e.g., a liquid polymeric material or an epoxy, which is transparent or translucent to at least particular wavelengths of light that are emitted by optical emitter chip 1225. Passive optical elements may be integrally or non-integrally formed from transparent encapsulation material 1228. For example, passive optical elements can be lens elements 1270 and/or 1275. In some methods, lens elements 1270 and/or 1275 can be shaped by means of a replication tool such as, e.g., by a mold. Transparent encapsulation material 1228 can be cured, for example, by applying energy to the material, e.g., in the form of heat and/or radiation.

Opaque coating 1280 and 1282 is applied to the surface of transparent encapsulation material 1228. Opaque coating 1280 and 1282 defines openings or apertures 1250 and 1255. Openings or apertures 1250 and 1255 in opaque coating 1280 and 1282 can be associated with passive optical elements, such as, for example, lens elements 1270 and/or 1275. Openings or apertures 1250 and 1255 in opaque coating 1280 and 1282 can be associated with particular elements of the optical device. According to one method, opaque coating 1280 and 1282 can be applied such that opaque coating 1280 forms an apron around lens element 1270. Opaque coating 1282 can be applied to substantially the entire top surface of transparent encapsulation blocks 1230 and 1232 other than apertures or openings 1250 and 1250. Opaque coating material 1280 and/or 1282 can be a photostructurable material such as, e.g., a resist or photoresist material that is substantially opaque to wavelengths of light emitted by optical emitter chip 1225, in order to at least substantially interfere with or prevent light emitted from optical emitter chip 1225 from passing through opaque coating 1280 or 1282. Opaque coating 1280 and 1282 can be applied by various methods, including, e.g. spray coating or spin coating. The methods used to apply opaque coatings 1280 and 1282 can be very precise and advantageously increase accurate construction. After application, opaque coating 1280 and 1282 can be developed using, for example, selective illumination means such as laser direct imaging (LDI) or using a mask.

As depicted in FIG. 12E, portions of cured transparent encapsulation material 1228 are removed, forming grooves. Removal of portions of transparent encapsulation material 1228 can be accomplished, for instance, by a dicing process, using, e.g., a dicing saw. The dimensions of the portions of cured transparent encapsulation material 1228 removed can be controlled, for example, by adjusting the depth by which blades of the dicing saw cut, or adjusting the width of the saw blade. According to some methods, dicing can remove a portion of substrate 1205, forming trench 1290. Dicing can also remove a portion of opaque dam 1245, creating a channel disposed in opaque dam 1245 on a side opposite from the optical sensor chip 1210. Dicing should not cut through opaque dam 1245, because damage to optical sensor chip 1210 would result. In this manner, opaque dam 1245 can act as a protective layer over optical sensor chip 1210 during the dicing process. The dicing process can define transparent encapsulation block 1230 and transparent encapsulation block 1232, with grooves between the blocks.

Opaque encapsulation material 1235 is applied on the sides of transparent encapsulation blocks 1230 and 1232. Opaque encapsulation material 1235 can be applied so as to encapsulate a plurality of side surface of transparent encapsulation block 1230 and a plurality of side surfaces of transparent encapsulation block 1232. During application, opaque encapsulation material 1235 fills the grooves between transparent encapsulation block 1230 and transparent encapsulation block 1232 formed during the dicing process. According to some methods, where the dicing process has formed a channel in opaque dam 1245, opaque encapsulation material 1235 extends into and fills the channel. In this manner, a light tight barrier can be formed between transparent encapsulation block 1230 and transparent encapsulation block 1232. In some methods, where the dicing process has formed trench 1290 in substrate 1205, opaque encapsulation material 1235 substantially fills trench 1290, facilitating a light tight interface. Opaque encapsulation material 1235 can be, for example, an epoxy which is substantially opaque to wavelengths of light emitted by optical emitter chip 1225, in order to at least substantially interfere with or prevent light emitted from optical emitter chip 1225 from passing through opaque encapsulation material 1235. According to certain methods, opaque encapsulation material 1235 can be in contact with opaque coating 1280 or 1282 to facilitate optical light tightness where opaque encapsulation material 1235 is in contact with opaque coating 1280. In some methods, opaque encapsulation material 1235 abuts opaque coating 1280 along one or more edges between the top surface of transparent encapsulation block 1230 and the one or more side surfaces of transparent encapsulation block 1230. According to some methods, opaque encapsulation material 1235 abuts opaque coating 1282 along one or more edges between the top surface of transparent encapsulation block 1232 and the one or more side surfaces of transparent encapsulation block 1232.

In another step, substrate 1205 can be singulated according to the method described with reference to FIG. 10F.

What is claimed is:

1. A method of forming an optical device, the method comprising:
    forming a substrate comprising a front surface;
    providing an optical emitter chip comprising a front surface and a rear surface, the rear surface of the optical emitter chip being disposed along the front surface of the substrate;
    providing an optical sensor chip comprising a front surface and a rear surface, the rear surface of the optical sensor chip being disposed along the front surface of the substrate, the optical sensor chip further comprising at least one main sensor and at least one reference sensor on the front surface of the optical sensor chip;
    forming an opaque dam on the front surface of the optical sensor chip and at least a portion of the front face of the substrate, the dam separating the main optical sensor and the reference sensor;
    forming a first transparent encapsulation block encapsulating the optical emitter chip and the reference optical sensor;
    forming a second transparent encapsulation block encapsulating the main optical sensor; and
    forming an opaque encapsulation material encapsulating the first transparent encapsulation block and the second transparent encapsulation block, the opaque encapsulation material defining a first opening above the main optical sensor and a second opening above the optical emitter chip,
    wherein the opaque encapsulation material extends between the first transparent encapsulation block and the second transparent encapsulation block and abuts the opaque dam.

2. The method of claim 1, wherein the opaque dam defines a channel into which the opaque encapsulation material extends.

3. The method of claim 1, wherein the forming the opaque encapsulation material further comprises forming a channel into which the opaque dam extends.

4. The method of claim 1, wherein the opaque dam is formed from a first opaque epoxy and the opaque encapsulation material is formed from a second opaque epoxy.

5. The method of claim 4, wherein the first opaque epoxy has a first viscosity and the second opaque epoxy has a second viscosity, the second viscosity different from the first viscosity.

6. The method of claim 1 further comprising:
    forming at least one trench in the substrate,
    wherein the forming the opaque encapsulation material comprises forming the opaque encapsulation material into the at least one trench.

7. The method of claim 1, wherein a thickness of the opaque dam disposed over the substrate material is different than a second thickness of the opaque dam disposed over the optical sensor chip.

8. The method of claim 1,
    wherein a first portion of the opaque dam disposed on the front surface of the optical sensor has a first thickness, and
    wherein a second portion of the opaque dam disposed on at least a portion of the front face of the substrate has a second thickness, the first thickness being less than the second thickness.

9. A method of forming an optical device, the method comprising:
    forming a substrate comprising a front surface;
    providing an optical emitter chip comprising a front surface and a rear surface, the rear surface of the optical emitter chip being disposed along the front surface of the substrate;
    providing an optical sensor chip comprising a front surface and a rear surface, the rear surface of the optical sensor chip being disposed along the front surface of the substrate, the optical sensor chip further comprising at least one main sensor and at least one reference sensor on the front surface of the optical sensor chip;
    forming an opaque dam on the front surface of the optical sensor chip and at least a portion of the front face of the substrate, the dam separating the main optical sensor and the reference sensor;
    forming a first transparent encapsulation block encapsulating the optical emitter chip and the reference optical sensor, the first transparent encapsulation block comprising a first passive optical element over the optical emitter chip;
    forming a second transparent encapsulation block encapsulating the main optical sensor, the second transparent encapsulation block comprising a second passive optical element over the main optical sensor;
    forming a first opaque coating material on the first transparent encapsulation block around the first passive optical element;
    forming a second opaque coating material on the second transparent encapsulation block around the second passive optical element; and
    forming an opaque encapsulation material encapsulating the first transparent encapsulation block and the second transparent encapsulation block, the opaque encapsulation material defining a first opening aligned with the first passive optical element and a second opening aligned with the second optical element,
    wherein the opaque encapsulation material extends between the first transparent encapsulation block and the second transparent encapsulation block and abuts the opaque dam.

10. The method of claim 9, wherein the opaque dam is formed to define a channel into which the opaque encapsulation material extends.

11. The method of claim 9, wherein the opaque encapsulation material is formed to define a channel into which the opaque dam extends.

12. The method of claim 9, wherein the opaque dam is formed from a first opaque epoxy and the opaque encapsulation material is formed from a second epoxy.

13. The method of claim 12, wherein the first opaque epoxy has a first viscosity and the second opaque epoxy has a second viscosity, the second viscosity different from the first viscosity.

14. The method of claim 9 further comprising:
forming at least one trench formed in the substrate,
wherein the forming the opaque encapsulation material comprises forming the opaque encapsulation material into the at least one trench.

15. The method of claim 9, wherein a thickness of the opaque dam disposed over the substrate material is different than a second thickness of the opaque dam disposed over the optical sensor chip.

16. The method of claim 9,
wherein a first portion of the opaque dam disposed on the front surface of the optical sensor has a first thickness, and
wherein a second portion of the opaque dam disposed on at least a portion of the front face of the substrate has a second thickness, the first thickness being less than the second thickness.

17. The method of claim 9, wherein first passive optical element is a lens element, the second passive optical element is a lens element, or the first and second passive optical elements are lens elements.

18. A method of fabricating an optical device, the method comprising:
forming a substrate comprising a front surface;
providing an optical emitter chip comprising a front surface and a rear surface, the rear surface of the optical emitter chip being disposed along the front surface of the substrate;
providing an optical sensor chip comprising a front surface and a rear surface, the rear surface of the optical sensor chip being disposed along the front surface of the substrate, the optical sensor chip further comprising at least one main sensor and at least one reference sensor on the front surface of the optical sensor chip;
forming an opaque dam on the front surface of the optical sensor chip and at least a portion of the front face of the substrate, the dam separating the main optical sensor and the reference sensor;
forming a first transparent encapsulation block encapsulating the optical emitter chip and the reference optical sensor, the first transparent encapsulation block comprising a first passive optical element over the optical emitter chip;
forming a second transparent encapsulation block encapsulating the main optical sensor, the second transparent encapsulation block comprising a second passive optical element over the main optical sensor;
forming a first opaque coating material on the first transparent encapsulation block around the first passive optical element, the first opaque coating material covering substantially all of a top surface of the first transparent encapsulation block;
forming a second opaque coating material on the second transparent encapsulation block around the second passive optical element, the second opaque coating material covering substantially all of a top surface of the second encapsulation block; and
forming an opaque encapsulation material encapsulating a plurality of side surfaces of the first transparent encapsulation block and encapsulating a plurality of side surfaces of the second transparent encapsulation block,
wherein the opaque encapsulation material extends between the first transparent encapsulation block and the second transparent encapsulation block and abuts the opaque dam, and
wherein the opaque encapsulation material abuts the first opaque coating material along one or more edges between the top surface of the first transparent encapsulation block and the one or more side surfaces of the first transparent encapsulation block, and
wherein the opaque encapsulation material abuts the second opaque coating material along one or more edges between the top surface of the second transparent encapsulation block and the one or more side surfaces of the second transparent encapsulation block.

19. The method of claim 18, wherein the forming the opaque dam comprises forming a channel into which the opaque encapsulation material extends.

20. The method of claim 18, wherein the opaque encapsulation material defines a channel into which the opaque dam extends.

21. The method of claim 18, wherein the opaque dam is formed from a first opaque epoxy and the opaque encapsulation material is formed from a second epoxy.

22. The method of claim 21, wherein the first opaque epoxy has a first viscosity and the second opaque epoxy has a second viscosity, the second viscosity different from the first viscosity.

23. The method of claim 18 further comprising:
forming at least one trench formed in the substrate,
wherein the forming the opaque encapsulation material comprises forming the opaque encapsulation material into the at least one trench.

24. The method of claim 18, wherein a thickness of the opaque dam disposed over the substrate material is different than a second thickness of the opaque dam disposed over the optical sensor chip.

25. The method of claim 18, wherein first passive optical element is a lens element, the second passive optical element is a lens element, or the first and second passive optical elements are lens elements.

* * * * *